US012772503B2

(12) United States Patent
Choi et al.

(10) Patent No.: US 12,772,503 B2
(45) Date of Patent: Oct. 20, 2026

(54) THIN FILM TRANSISTOR AND DISPLAY APPARATUS COMPRISING THE SAME

(71) Applicant: LG Display Co., Ltd., Seoul (KR)

(72) Inventors: Sungju Choi, Paju-si (KR); Hyeonjoo Seul, Paju-si (KR); Jinwon Jung, Paju-si (KR); Jaeyoon Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 571 days.

(21) Appl. No.: 18/457,520

(22) Filed: Aug. 29, 2023

(65) Prior Publication Data

US 2024/0213375 A1 Jun. 27, 2024

(30) Foreign Application Priority Data

Dec. 26, 2022 (KR) ........................ 10-2022-0184668

(51) Int. Cl.
*H10D 30/67* (2025.01)

(52) U.S. Cl.
CPC ..... *H10D 30/6757* (2025.01); *H10D 30/6755* (2025.01)

(58) Field of Classification Search
CPC ........... H10D 30/6755; H10D 30/6757; H10D 30/6723; H10D 86/423; H10D 86/481; H10D 86/60; H10D 99/00; H10D 62/10; H10D 62/124; H10D 62/235; H10K 59/1213
USPC .......................................................... 257/288
See application file for complete search history.

(56) References Cited

U.S. PATENT DOCUMENTS

| | | | | |
|---|---|---|---|---|
| 2014/0264324 | A1 | 9/2014 | Yamazaki | |
| 2020/0194699 | A1 | 6/2020 | Sung et al. | |
| 2023/0146562 | A1* | 5/2023 | Lee .................... | H10D 30/6757 257/40 |

FOREIGN PATENT DOCUMENTS

| | | | |
|---|---|---|---|
| CN | 114628528 | A | 6/2022 |
| JP | 2013-38400 | A | 2/2013 |
| JP | 2013-38402 | A | 2/2013 |
| JP | 2015-188063 | A | 10/2015 |
| JP | 2016-105474 | A | 6/2016 |
| KR | 10-2015-0129825 | A | 11/2015 |
| KR | 10-2023-0067042 | A | 5/2023 |

(Continued)

*Primary Examiner* — Monica D Harrison
(74) *Attorney, Agent, or Firm* — Birch, Stewart, Kolasch & Birch, LLP

(57) ABSTRACT

A thin film transistor including an active layer; and a gate electrode at least partially overlapped with the active layer. Further, the active layer includes a first active layer and a second active layer on the first active layer; a channel; a first connection portion contacting a first side of the channel; and a second connection portion contacting a second side of the channel. In addition, the channel includes a first overlap area in which the first active layer and the second active layer overlap each other based on a plan view; and a first non-overlap area in which the first active layer and the second active layer do not overlap each other based on the plan view. Also, in the channel of the active layer, each of the first active layer and the second active layer extends from the first connection portion to the second connection portion. The second active layer also has a mobility greater than a mobility of the first active layer.

21 Claims, 26 Drawing Sheets

(56) References Cited

FOREIGN PATENT DOCUMENTS

| | | | |
|---|---|---|---|
| TW | 201824224 | A | 7/2018 |
| TW | 202119380 | A | 5/2021 |

* cited by examiner

THIN FILM TRANSISTOR AND DISPLAY APPARATUS COMPRISING THE SAME

CROSS-REFERENCE TO RELATED APPLICATIONS

This application claims the benefit of the Korean Patent Application No. 10-2022-0184668 filed on Dec. 26, 2022, which is hereby expressly incorporated by reference into the present application.

BACKGROUND OF THE DISCLOSURE

Field of the Invention

The present disclosure relates to a thin film transistor and a display apparatus comprising the same.

Discussion of the Related Art

Transistors are widely used as switching devices or driving devices in the field of electronic apparatuses. In particular, because a thin film transistor can be manufactured on a glass substrate or a plastic substrate, the thin film transistor is widely used as a switching device of a display apparatus such as a liquid crystal display apparatus or an organic light emitting apparatus.

The display apparatus may include, for example, a switching thin film transistor and a driving thin film transistor. Generally, it is preferable that the driving thin film transistor has a large s-factor (or sub-threshold swing) to represent a gray scale. However, the thin film transistors generally have a small s-factor to ensure on-off characteristics. Thus, when thin film transistors are applied to the driving thin film transistor of the display apparatus, it is difficult to represent a gray scale of the display apparatus.

Therefore, the thin film transistor applied to the driving thin film transistor of the display apparatus also needs to have a large s-factor to easily represent a gray scale. Also, even though the thin film transistor has a large s-factor, the thin film transistor should have excellent current characteristics in an ON-state.

SUMMARY OF THE DISCLOSURE

The present disclosure has been made in view of the above problems and it is an object of the present disclosure to provide a thin film transistor that has a large s-factor and has excellent current characteristics in an ON-state.

It is another object of the present disclosure to provide a thin film transistor having a large current value in an ON-state while having a large s-factor by partially stacking two different types of oxide semiconductor layers to form a two-channel structure.

It is still another object of the present disclosure to provide a thin film transistor designed such that an interval between a gate electrode and an active layer is not greater than necessary to have excellent ON-current characteristics as the interval between the gate electrode and the active layer does not need to be increased to increase an s-factor of the thin film transistor.

It is further still another object of the present disclosure to provide a display apparatus including a driving thin film transistor having a large s-factor and large ON-current characteristics to have an excellent gray scale representation capability and excellent current characteristics.

In addition to the objects of the present disclosure as mentioned above, additional objects and features of the present disclosure will be clearly understood by those skilled in the art from the following description of the present disclosure.

In accordance with an aspect of the present disclosure, the above and other objects are accomplished by including a thin film transistor having an active layer, and a gate electrode at least partially overlapped with the active layer. Further, the active layer includes a channel portion (e.g. a channel), a first connection portion contacting one side of the channel portion, and a second connection portion contacting the other side of the channel portion, the active layer includes a first active layer and a second active layer on the first active layer, the channel portion includes a first overlap area in which the first active layer and the second active layer overlap each other based on a plan view, and a first non-overlap area in which the first active layer and the second active layer do not overlap each other based on the plan view. Also, each of the first active layer and the second active layer extends from the first connection portion to the second connection portion in the channel portion. In this instance, the second active layer can have a mobility greater than a mobility of the first active layer.

In addition, the first overlap area can extend from the first connection portion to the second connection portion, and first non-overlap area can extend from the first connection portion to the second connection portion. The second active layer can cover an entire upper surface of the first active layer in the channel portion, and the second active layer can be disposed in an entire area of the channel portion based on the plan view. Also, the first active layer is not disposed in the first non-overlap area.

The active layer may further include a third active layer on the second active layer, and the third active layer can extend from the first connection portion to the second connection portion in the channel portion. The third active layer can also have a mobility smaller than a mobility of the second active layer. Also, the third active layer can be disposed in the first overlap area and the first non-overlap area. However, the third active layer may not be disposed in the first non-overlap area.

In addition, the channel portion can further include a second non-overlap area in which the first active layer and the second active layer do not overlap each other based on the plan view, and the second non-overlap area can be spaced apart from the first non-overlap area and may extend from the first connection portion to the second connection portion. The first active layer may not be disposed in the second non-overlap area.

Further, the active layer can further include a third active layer on the second active layer, and the third active layer can extend from the first connection portion to the second connection portion in the channel portion. The third active layer can also have a mobility smaller than a mobility of the second active layer, and be disposed in the first overlap area, the first non-overlap area and the second non-overlap area. Also, the third active layer may not be disposed in the second non-overlap area.

In addition, the channel portion can further include a second overlap area in which the first active layer and the second active layer overlap each other based on the plan view, and the second overlap area can be spaced apart from the first overlap area, and thus can extend from the first connection portion to the second connection portion.

The active layer can further include a third active layer on the second active layer, and the third active layer can extend from the first connection portion to the second connection portion in the channel portion. The third active layer can also have a mobility smaller than a mobility of the second active layer, and be disposed in the first overlap area, the first non-overlap area and the second overlap area. However, the third active layer may not be disposed in the first non-overlap area.

In addition, the first active layer can include at least one of an IGZO(InGaZnO)-based oxide semiconductor material, a GZO(GaZnO)-based oxide semiconductor material, an IGO(InGaO)-based oxide semiconductor material, or a GZTO(GaZnSnO)-based oxide semiconductor material, and when the oxide semiconductor material of the first active layer includes gallium (Ga) and indium (In), a concentration of gallium (Ga) may be higher than a concentration of indium (In) based on the number of moles [Ga concentration> In concentration].

The second active layer may include at least one of an IGZO(InGaZnO)-based oxide semiconductor material, an IZO(InZnO)-based oxide semiconductor material, an ITZO (InSnZnO)-based oxide semiconductor material, an IGZTO (InGaZnSnO)-based oxide semiconductor material, a FIZO (FeInZnO)-based semiconductor material, a ZnO-based oxide semiconductor material, a SIZO(SiInZnO)-based oxide semiconductor material, or a ZnON(Zn-Oxynitride)-based oxide semiconductor material, and when the oxide semiconductor material of the second active layer includes gallium (Ga) and indium (In), a concentration of indium (In) may be higher than a concentration of gallium (Ga) based on the number of moles [Ga concentration<In concentration].

In accordance with another aspect of the present disclosure, the above and other objects can be accomplished by the provision of a display apparatus comprising the above-described thin film transistor.

BRIEF DESCRIPTION OF THE DRAWINGS

The above and other objects, features and advantages of the present disclosure will be more clearly understood from the following detailed description taken in conjunction with the accompanying drawings, in which.

DETAILED DESCRIPTION OF THE DISCLOSURE

Figure 1A:
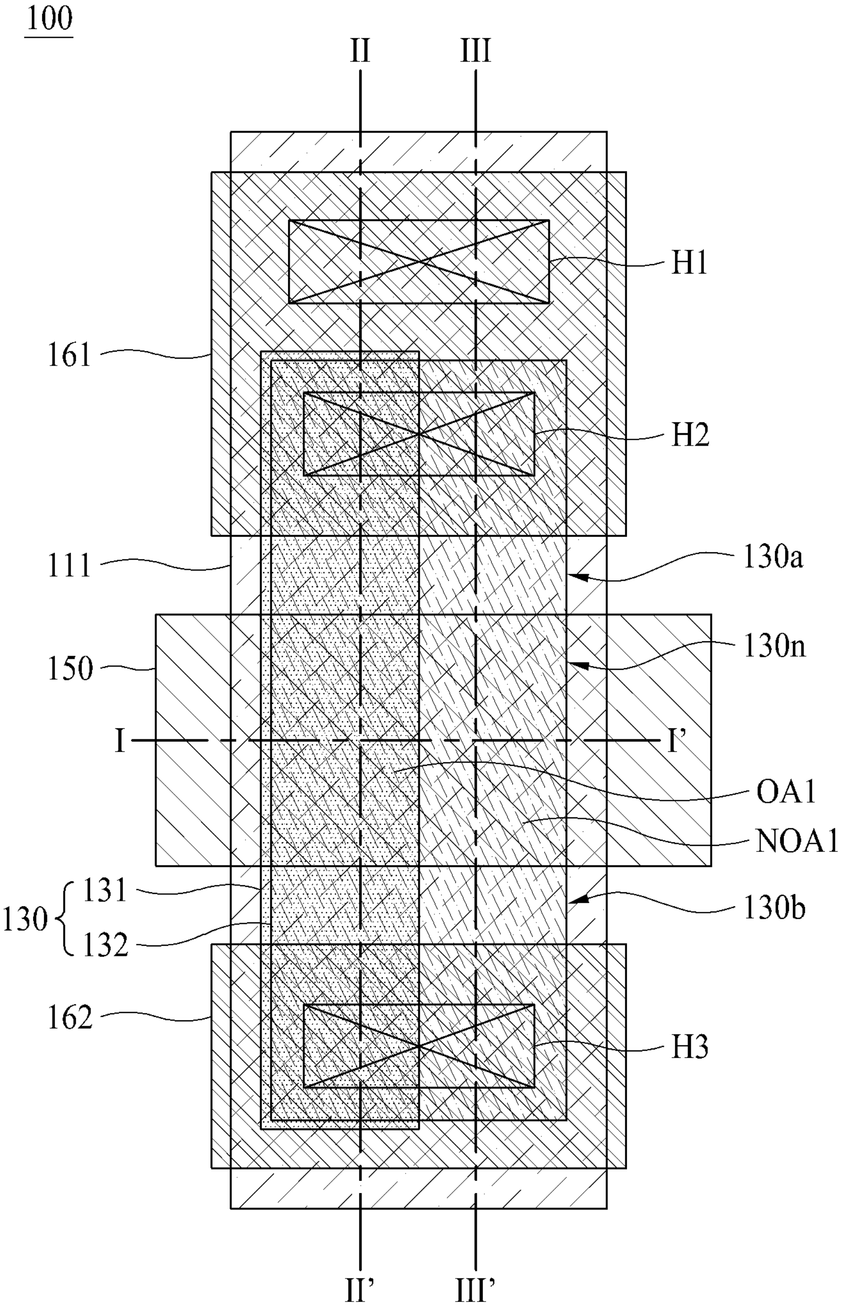
FIG. 1A is a plan view illustrating a thin film transistor according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully explain the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification.

When 'comprise', 'have', and 'include' described in the present specification are used, another part may be added unless 'only~' is used. The terms of a singular form may include plural forms unless referred to the contrary. In construing an element, the element is construed as including an error range although there is no explicit description. In describing a position relationship, for example, when the position relationship is described as 'upon~', 'above~', 'below~', and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. These terms are intended to encompass different orientations of the device in addition to the orientation depicted in the figures. For example, if the device illustrated in the figure is reversed, the device described to be arranged "below," or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used. Although the terms "first", "second," etc. may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and be variously inter-operated with each other and driven technically as those skilled in the art can sufficiently understand. The embodiments of the present disclosure can be performed independently from each other, or be performed together in a co-dependent relationship.

In the drawings, the same or similar elements are denoted by the same reference numerals even though they are depicted in different drawings. In the embodiments of the present disclosure, a source electrode and a drain electrode are distinguished from each other, for convenience of description. However, the source electrode and the drain electrode may be used interchangeably. Further, the source electrode can be the drain electrode, and the drain electrode can be the source electrode. Also, the source electrode in any one embodiment of the present disclosure can be the drain electrode in another embodiment of the present disclosure, and the drain electrode in any one embodiment of the present disclosure can be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region can be a source electrode, and a drain region can be a drain electrode. Also, a source region can be a drain electrode, and a drain region can be a source electrode. In addition, in some embodiments of the present disclosure, the term "channel" may mean "channel portion", and the term "channel portion" may mean "channel".

Figure 1B:
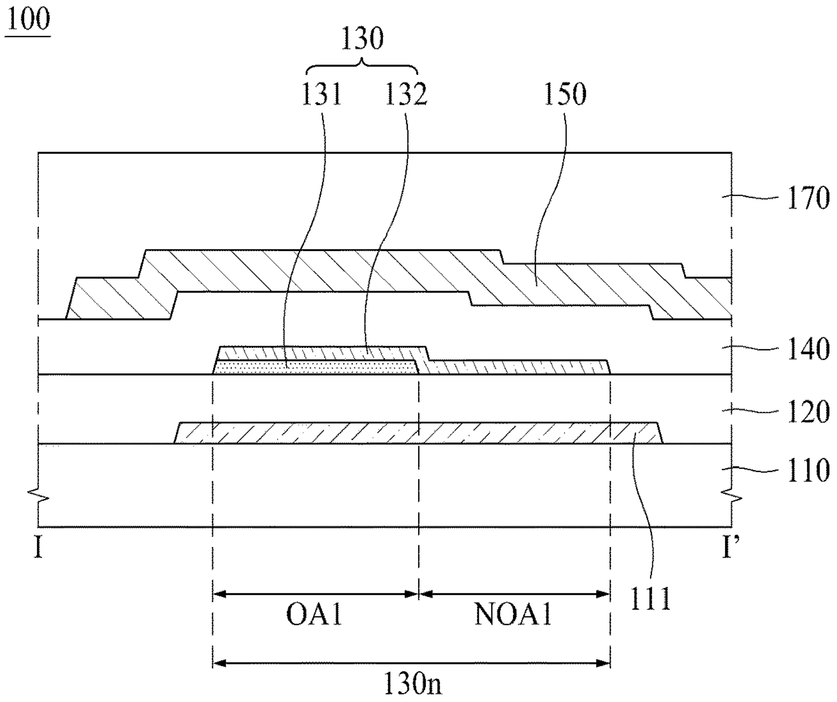
FIG. 1B is a cross-sectional view taken along line I-I' of FIG. 1A.
Figure 1C:
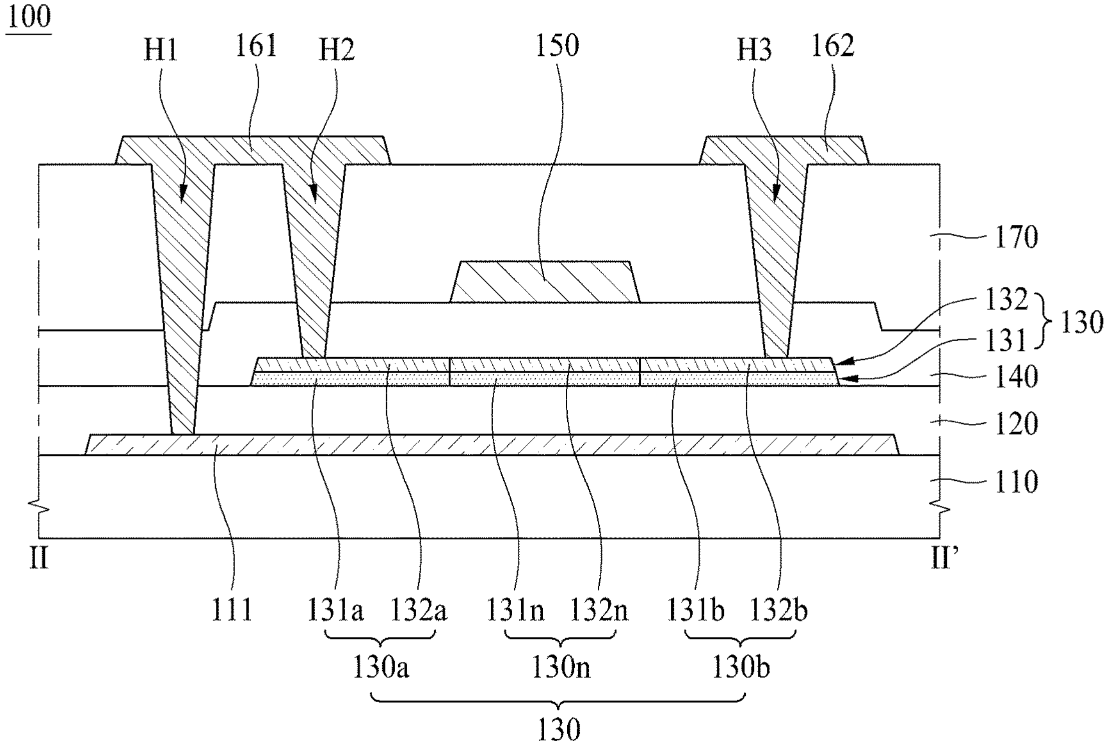
FIG. 1C is a cross-sectional view taken along line II-II' of FIG. 1A.
Figure 1D:
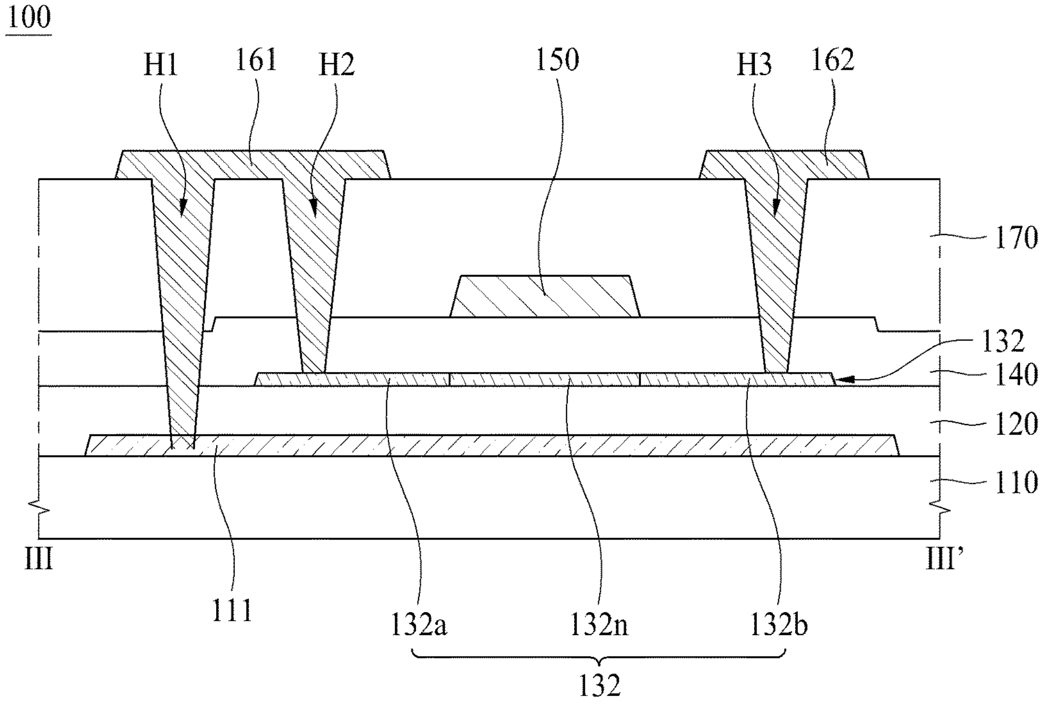
FIG. 1D is a cross-sectional view taken along line III-III' of FIG. 1A.

Next, FIG. 1A is a plan view illustrating a thin film transistor according to one embodiment of the present disclosure, FIG. 1B is a cross-sectional view taken along line I-I' of FIG. 1A, FIG. 1C is a cross-sectional view taken along line II-II' of FIG. 1A, and FIG. 1D is a cross-sectional view taken along line III-III' of FIG. 1A.

As shown, a thin film transistor 100 according to one embodiment of the present disclosure includes an active layer 130 and a gate electrode 150 that at least partially overlaps the active layer 130. The active layer 130 includes a channel portion 130*n*, a first connection portion 130*a* contacting one side of the channel portion 130*n*, and a second connection portion 130*b* contacting the other side of the channel portion 130*n*. Also, the active layer 130 includes a first active layer 131 and a second active layer 132 on the first active layer 131. In the embodiments of the present disclosure, the channel portion can be referred to as "channel", and the channel portion 130*n* may be referred to as "channel 130*n*."

In addition, as shown in FIG. 1B, the channel portion 130*n* includes a first overlap area OA1 in which the first active layer 131 and the second active layer 132 overlap each other based on the plan view, and a first non-overlap area NOA1 in which the first active layer 131 and the second active layer 132 do not overlap each other based on the plan view. In the channel portion 130*n*, each of the first active layer 131 and the second active layer 132 is extended from the first connection portion 130*a* to the second connection portion 130*b*.

Hereinafter, the thin film transistor 100 according to one embodiment of the present disclosure will be described in more detail with reference to FIGS. 1A to 1D. Referring to FIGS. 1A to 1D, the thin film transistor 100 is disposed on a substrate 110. Glass or plastic can be used as the substrate 110. A transparent plastic having a flexible property, for example, polyimide can be used as the plastic. When polyimide is used as the substrate 110, a heat-resistant polyimide capable of enduring a high temperature can be used considering that a high temperature deposition process is performed on the substrate 110.

Also, a light shielding layer 111 can be disposed on the substrate 110. The light shielding layer 111 has light shielding characteristics to shield light incident from the outside, thereby protecting the channel portion 130*n*. The light shielding layer 111 can be disposed to overlap at least the channel portion 130*n* of the active layer 130.

Further, the light shielding layer 111 can include a metal, and have electrical conductivity. For example, the light shielding layer 111 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), titanium (Ti), or iron (Fe). The light shielding layer 111 can also have a multi-layered structure that includes at least two conductive layers having different respective physical properties.

A buffer layer 120 is also disposed on the substrate 110 and the light shielding layer 111. The buffer layer 120 can include at least one selected from silicon oxide, silicon nitride or metal-based oxide as an insulating material. The buffer layer 120 can also have a single-layered structure or a multi-layered structure.

Further, the buffer layer 120 planarizes an upper portion of the substrate 110. In addition, the buffer layer 120 can have air and moisture barrier properties and insulating properties to protect the thin film transistor 100. The buffer layer 120 also allows the light shielding layer 111 and the channel portion 130*n* to be spaced apart from and insulated from each other.

As shown, the active layer 130 is disposed on the buffer layer 120. The active layer 130 can be formed by a semiconductor material. According to one embodiment of the present disclosure, the active layer 130 may include an oxide semiconductor material.

Referring to FIGS. 1A to 1D, the active layer 130 includes a first active layer 131 and a second active layer 132 on the first active layer 131. The first active layer 131 can be disposed to overlap the second active layer 132. In addition, the second active layer 132 can have a mobility greater than that of the first active layer 131. As a result, in the thin film transistor 100, the second active layer 132 may serve as a main layer of a current flow. According to one embodiment of the present disclosure, the second active layer 132 can have a mobility that is twice or greater than that of the first active layer 131. The second active layer 132 can have a mobility of 2 to 5 times as compared with the first active layer 131.

For example, the first active layer 131 can have a mobility of 5 $cm^2/V \cdot s$ to 25 $cm^2/V \cdot s$. In more detail, the first active layer 131 can have a mobility of 5 $cm^2/V \cdot s$ to 15 $cm^2/V \cdot s$, or can have a mobility of about 10 $cm^2/V \cdot s$. The second active layer 132 can have a mobility of 20 $cm^2/V$'s or more. In more detail, the second active layer 132 can have a mobility of 20 $cm^2/V \cdot s$ to 50 $cm^2/V \cdot s$. In more detail, the second active layer 132 can have a mobility in the range of 20 $cm^2/V \cdot s$ to 40 $cm^2/V \cdot s$ or 20 $cm^2/V \cdot s$ to 30 $cm^2/V \cdot s$.

Further, the second active layer 132 can have a mobility greater than that of the first active layer 131 as much as 10 $cm^2/V \cdot s$ to 40 $cm^2/V \cdot s$. The second active layer 132 can have a mobility greater than that of the first active layer 131 as much as 10 $cm^2/V \cdot s$ to 30 $cm^2/V \cdot s$, 10 $cm^2/V \cdot s$ to 20 $cm^2/V \cdot s$, or 20 $cm^2/V \cdot s$ to 30 $cm^2/V \cdot s$.

The first active layer 131 can include an oxide semiconductor material having excellent stability. In addition, the first oxide semiconductor layer 131 supports the second oxide semiconductor layer 132. Therefore, the first oxide semiconductor layer 131 is also referred to as a "support layer." The first active layer 131 can include at least one of, for example, an IGZO(InGaZnO)-based oxide semiconductor material, a GZO(GaZnO)-based oxide semiconductor material, an IGO(InGaO)-based oxide semiconductor material, or a GZTO(GaZnSnO)-based oxide semiconductor material. When the oxide semiconductor material constituting the first active layer 131 includes gallium (Ga) and indium (In), a concentration of gallium (Ga) is set to be higher than that of indium (In) based on the number of moles [Ga concentration>In concentration].

The second active layer 132 can include an oxide semiconductor material having high mobility. The second active layer 132 may include at least one of, for example, an IGZO(InGaZnO)-based oxide semiconductor material, an IZO(InZnO)-based oxide semiconductor material, an ITZO (InSnZnO)-based oxide semiconductor material, an IGZTO (InGaZnSnO)-based oxide semiconductor material, a FIZO (FeInZnO)-based semiconductor material, a ZnO-based oxide semiconductor material, a SIZO(SiInZnO)-based oxide semiconductor material, or a ZnON(Zn-Oxynitride)-based oxide semiconductor material. When the oxide semiconductor material constituting the second active layer 132 includes gallium (Ga) and indium (In), a concentration of indium (In) is set to be higher than that of gallium (Ga) based on the number of moles [Ga concentration<In concentration].

However, the type of the oxide semiconductor material is not limited to the above example, and the first active layer 131 and the second active layer 132 can include other oxide semiconductor materials known in the art. Referring to FIGS. 1A, 1C and 1D, the active layer 130 includes a channel portion 130*n*, a first connection portion 130*a* contacting one side of the channel portion 130*n*, and a second connection portion 130*b* contacting the other side of the channel portion 130*n*.

The channel portion 130*n* overlaps the gate electrode 150, and serves as a channel of the thin film transistor 100. One side of the channel portion 130*n* contacts the first connection portion 130*a*, and the other side of the channel portion 130*n* contacts the second connection portion 130*b*.

As shown, the first connection portion 130*a* and the second connection portion 130*b* of the active layer 130 do not overlap the gate electrode 150. In addition, the first connection portion 130*a* and the second connection portion 130*b* can be formed by selective conductorization of a semiconductor material. According to one embodiment of the present disclosure, providing a conductivity to a selected portion of the active layer 130 will be referred to as selective conductorization. The selective conductorization can be performed by doping, plasma treatment or the like.

For example, selective conductorization for the active layer 130 can be performed by dopant doping using the gate electrode 150 or photoresist as a mask. Implantation of dopant ions into a selected area of the active layer 130 will be referred to as dopant doping. The dopant may include at least one of, for example, boron (B), phosphorus (P), fluorine (F) or hydrogen (H).

When the selective conductorization for the active layer 130 is performed by dopant doping or implantation, an area doped with a dopant in the active layer 130 is selectively conductorized to become the first connection portion 130*a* or the second connection portion 130*b*. An area of the active layer 130, which is not doped with a dopant, is not conductorized, and becomes the channel portion 130*n*.

In addition, the selective conductorization for the active layer 130 can be performed by plasma treatment applied to a process of patterning a gate insulating layer 140. For example, plasma can be used in the process of patterning the gate insulating layer 140, and a portion of the active layer 130, which is in contact with the plasma, can be selectively conductorized to become the first connection portion 130*a* or the second connection portion 130*b*. A portion of the active layer 130, which is protected by the gate insulating layer 140 and does not contact the plasma, is not conductorized, and can become the channel portion 130*n*.

The first connection portion 130*a* and the second connection portion 130*b* are portions made of an oxide semiconductor material and then given conductivity. Therefore, the first connection portion 130*a* and the second connection portion 130*b* have a greater electrical conductivity than that of the channel portion 130*n*. That is, by conductorization, the first connection portion 130*a* and the second connection portion 130*b* can have an electrical conductivity similar to that of a metal used as an electrical wiring.

Referring to FIG. 1C, the channel portion 130*n* may include a channel portion 131*n* of the first active layer 131 and a channel portion 132*n* of the second active layer 132. The first connection portion 130*a* includes a first connection portion 131*a* of the first active layer 131 and a first connection portion 132*a* of the second active layer 132. Also, the second connection portion 130*b* includes a second connection portion 131*b* of the first active layer 131 and a second connection portion 132*b* of the second active layer 132.

Further, the first connection portion 130*a* of the active layer 130 can be a source area, and the second connection portion 130*b* thereof can be a drain area. Therefore, the first connection portion 130*a* can serve as a source electrode, and the second connection portion 130*b* can serve as a drain electrode. However, the present disclosure is not limited to the above example, and the first connection portion 130*a* can be a drain area, and the second connection portion 130*b* can be a source area.

In addition, the channel portion 130*n* includes a first overlap area OA1 in which the first active layer 131 and the second active layer 132 overlap each other based on a plan view, and a first non-overlap area NOA1 in which the first active layer 131 and the second active layer 132 do not overlap each other based on the plan view.

As shown, each of the first active layer 131 and the second active layer 132 in the channel portion 130*n* extends from the first connection portion 130*a* to the second connection portion 130*b*. As a result, the first overlap area OA1 can extend from the first connection portion 130*a* to the second connection portion 130*b*. In addition, the first non-overlap area NOA1 can be extend from the first connection portion 130*a* to the second connection portion 130*b*.

Because the first overlap area OA1 and the first non-overlap area NOA1 can be extended from the first connection portion 130*a* to the second connection portion 130*b*, both the first overlap area OA1 and the first non-overlap area NOA1 can serve as channels of the thin film transistor 100.

Referring to FIGS. 1A and 1B, the second active layer 132 can be disposed in the entire area of the channel portion 130*n* based on the plan view. In addition, the first active layer 131 can be disposed only in the first overlap area OA1 without being disposed in the first non-overlap area NOA1. According to one embodiment of the present disclosure, in the channel portion 130*n*, the second active layer 132 can cover an entire upper surface of the first active layer 131.

FIG. 1C is a cross-sectional view illustrating a first overlap area OA1, and FIG. 1D is a cross-sectional view illustrating a first non-overlap area NOA1. As shown in FIGS. 1C and 1D, the first active layer 131 and the second active layer 132 are disposed to overlap each other in the first overlap area OA1, whereas only the second active layer 132 is disposed in the first non-overlap area NOA1. Therefore, the first overlap area OA1 can have a carrier that is more abundant than that of the first non-overlap area NOA1. In more detail, the first overlap area OA1 can have an electron carrier that is more abundant than that of the first non-overlap area NOA1.

As a result, the ON-current of the thin film transistor 100 can be improved by the first overlap area OA1. Therefore, the thin film transistor 100 having the first overlap area OA1 can have excellent current characteristics.

Also, the first non-overlap area NOA1 has a carrier having a concentration lower than that of the first overlap area OA1. In more detail, the first non-overlap area NOA1 can have an electron carrier of a concentration lower than that of the first overlap area OA1. Therefore, before the thin film transistor 100 is completely turned on by applying a gate voltage, a current increase rate of the thin film transistor can be delayed. As a result, an s-factor (sub-threshold swing) of the thin film transistor 100 can be increased.

As described above, the channel portion 130*n* includes the first overlap area OA1 and the first non-overlap area NOA1 together, so that the ON-current of the thin film transistor 100 can be improved and at the same time, the s-factor can be increased.

Referring to FIGS. 1B-1D, the gate insulating layer 140 is disposed on the active layer 130 and protects the channel portion 130*n*. The gate insulating layer 140 can include at least one of silicon oxide, silicon nitride or metal-based oxide and can have a single-layered structure or a multi-layered structure.

Referring to FIGS. 1B to 1D, the gate insulating layer 140 can be integrally formed on the entire surface of the substrate 110, but the present disclosure is not limited thereto, and the gate insulating layer 140 can be patterned. For example, the gate insulating layer 140 can be patterned to have a shape corresponding to that of the gate electrode 150.

Further, the gate electrode 150 is disposed on the gate insulating layer 140 and overlaps the channel portion 130*n* of the active layer 130. The gate electrode 150 can include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). The gate electrode 150 can also have a multi-layered structure that includes at least two conductive layers having their respective physical properties different from each other.

An interlayer insulating layer 170 is disposed on the gate electrode 150 and is an insulating layer made of an insulating material. The interlayer insulating layer 170 can be made of an organic material or an inorganic material, or can be made of a stacked body of an organic material layer and an inorganic material layer.

A source electrode 161 and a drain electrode 162 are disposed on the interlayer insulating layer 170. As shown, the source electrode 161 is connected to the active layer 130 through a contact hole H2. In more detail, the source electrode 161 can be electrically connected to the first connection portion 130*a* of the active layer 130 through the contact hole H2. The source electrode 161 can also be connected to the light shielding layer 111 through a contact hole H1. As a result, the light shielding layer 111 can be connected to the first connection portion 130*a* of the active layer 130.

In addition, the drain electrode 162 is spaced apart from the source electrode 161 and is thus connected to the active layer 130 through a contact hole H3. In more detail, the drain electrode 162 can be electrically connected to the second connection portion 130*b* of the active layer 130 through a contact hole H3.

Each of the source electrode 161 and the drain electrode 162 can include at least one of molybdenum (Mo), aluminum (Al), chromium (Cr), gold (Au), titanium (Ti), nickel (Ni), neodymium (Nd), copper (Cu) or their alloy. Each of the source electrode 161 and the drain electrode 162 can also be formed of a single layer made of a metal or a metal alloy, or can be formed of a multi-layer of two or more layers.

However, the present disclosure is not limited to the above example, and the first connection portion 130*a* can be a source electrode and an electrode indicated by a reference numeral “161” can be a connection electrode or a bridge. Likewise, the second connection portion 130*b* can be a drain electrode and an electrode indicated by a reference numeral “162” can be a connection electrode or a bridge.

Hereinafter, the s-factor will be described in more detail. At a threshold voltage Vth of a drain-source current graph for a gate voltage of the thin film transistor 100, the s-factor (sub-threshold swing) can be used as an index indicating a change level of the drain-source current for the gate voltage. The s-factor can be described by a current-change graph shown in FIG. 13B, for example.

Figure 13A:
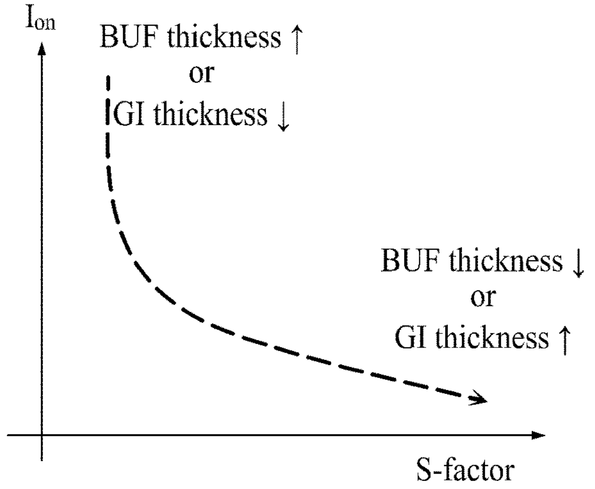
FIG. 13A is a graph illustrating a relation between an s-factor and an ON-current.
Figure 13B:
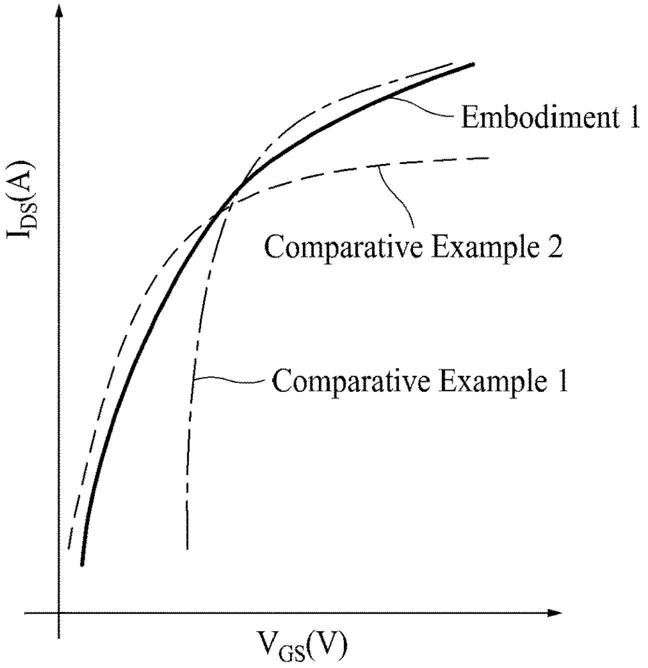
FIG. 13B is a graph illustrating threshold voltages of thin film transistors.

In particular, FIG. 13B illustrates a drain-source current $I_{DS}$ for a gate voltage $V_{GS}$. At the threshold voltage Vth of the thin film transistor 100, a reciprocal of a slope in the graph of the drain-source current $I_{DS}$ for the gate voltage $V_{GS}$ can be defined as the s-factor. When the slope of the graph is steep, the s-factor is small, and when the slope of the graph is small, the s-factor is large. When the s-factor is large, a change rate of the drain-source current $I_{DS}$ for the gate voltage at a period of the threshold voltage Vth is slow. When the s-factor is large, since the change rate of the drain-source current $I_{DS}$ for the gate voltage is slow, it is easy to adjust a magnitude of the drain-source current $I_{DS}$ by adjusting the gate voltage $V_{GS}$.

In the display apparatus driven by the current, for example, in an organic light emitting display apparatus, a gray scale of a pixel can be controlled by adjusting the magnitude of the drain-source current $I_{DS}$ of the driving thin film transistor. The magnitude of the drain-source current $I_{DS}$ of the driving thin film transistor is determined by the gate voltage. Therefore, in the organic light emitting display apparatus driven by the current, it is easy to adjust a gray scale of a pixel as the s-factor of the driving thin film transistor TR becomes large.

As a method for adjusting the s-factor of the thin film transistor 100 includes adjusting a thickness of the gate insulating layer 140. In more detail, FIGS. 11A and 11B are schematic views illustrating a gate voltage applied to a thin film transistor.

Figure 11A:
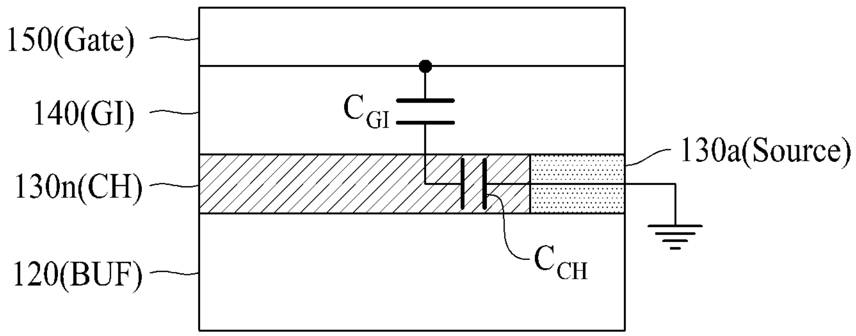
FIGS. 11A and 11B are schematic views illustrating a gate voltage applied to a thin film transistor.

As shown, FIG. 11A schematically illustrates a capacitance Cap that can be generated when a gate voltage $V_{GS}$ is applied to the thin film transistor. In particular, FIG. 11A schematically illustrates a relation of the capacitance Cap and a voltage before the thin film transistor is completely turned on. In FIG. 11A, the gate voltage $V_{GS}$ is a voltage between the source electrode 161 and the gate electrode 150. The gate voltage $V_{GS}$ can be referred to as a voltage between the first connection portion 130*a* and the gate electrode 150.

As shown in FIG. 11A, when the gate voltage $V_{GS}$ is applied to the thin film transistor, a capacitance $C_{GI}$ can be formed between the channel portion 130*n* of the active layer 130 and the gate electrode 150 (Gate), and a capacitance $C_{CH}$ can be also formed between the channel portion 130*n* and the first connection portion 130*a* (Source). The capacitance $C_{CH}$ formed between the channel portion 130*n* and the first connection portion 130*a* (Source) can be referred to as a capacitance formed by a voltage difference between the drain electrode 162, which is a high voltage terminal, and the source electrode 161, which is a low voltage terminal, in the channel portion 130*n* made of an oxide semiconductor layer having N-type semiconductor characteristics.

Figure 11B:
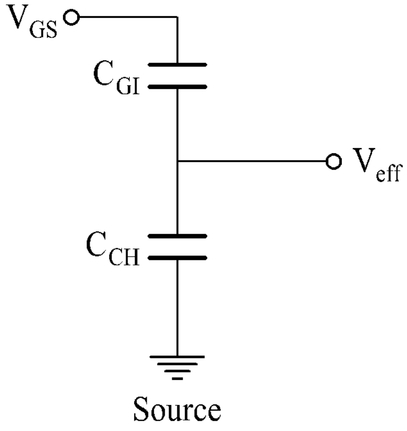

The relation between the capacitance Cap and the voltage according to FIG. 11A can be represented as shown in FIG. 11B. Referring to FIG. 11B, due to the capacitance $C_{CH}$ between the channel portion 130*n* and the first connection portion 130*a* (Source), not all gate voltages $V_{GS}$ are effectively applied to the channel portion 130*n*. As a result, voltage loss can be generated.

Referring to FIG. 11B, when one of the gate voltages $V_{GS}$, which is effectively applied to the channel portion 130*n* during driving of the thin film transistor, is referred to as an effective gate voltage $V_{eff}$, the effective gate voltage $V_{eff}$ can be obtained by the following Equation 1.

$$V_{eff}=[C_{GI}/(C_{GI}+C_{CH})]\times V_{GS} \quad \text{[Equation 1]}$$

In order to increase the s-factor of the thin film transistor 100, when the thickness of the gate insulating layer 140 is increased, a capacitance $C_{GI}$ is reduced between the channel portion 130*n* of the active layer 130 and the gate electrode 150 (Gate), so that an effective gate voltage $V_{eff}$, which is effectively applied to the channel portion 130*n*, among the gate voltages $V_{GS}$ can be reduced. As a result, the s-factor can be increased, but the effective gate voltage $V_{eff}$ calculated by the Equation 1 is also reduced, and the ON-Current of the thin film transistor 100 is reduced.

On the other hand, according to one embodiment of the present disclosure, because the channel portion 130*n* includes the first overlap area OA1 and the first non-overlap area NOA1 together, the s-factor of the thin film transistor 100 can be increased without reducing the ON-Current.

Figure 12A:
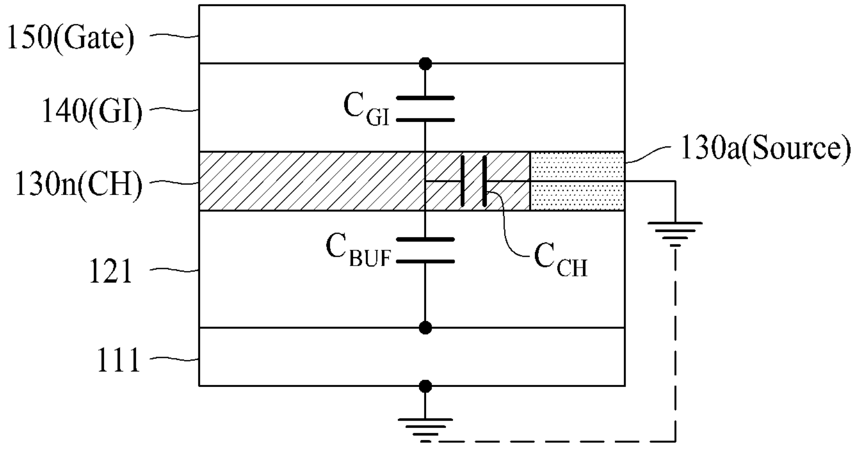
FIGS. 12A and 12B are schematic views illustrating a gate voltage applied to a thin film transistor.
Figure 12B:
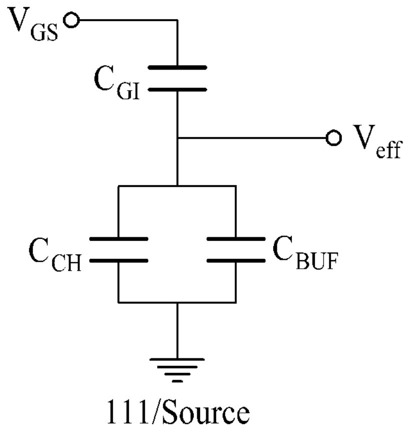

Next, FIGS. 12A and 12B are schematic views illustrating a gate voltage applied to the thin film transistor 100 and describing an example that the light shielding layer 111 is connected to the source electrode 161. As shown in FIG. 12A, when the gate voltage $V_{GS}$ is applied to the thin film transistor 100, the capacitance $C_{GI}$ can be formed between the channel portion 130*n* of the active layer 130 and the gate electrode 150, the capacitance $C_{CH}$ can be formed between the channel portion 130*n* and the first connection portion 130*a* (Source), and a capacitance $C_{BUF}$ can be additionally formed between the channel portion 130*n* and the light shielding layer 111.

The relation between the capacitance Cap and the voltage according to FIG. 12A can be represented as shown in FIG. 12B. Referring to FIG. 12B, due to the capacitance $C_{CH}$ between the channel portion 130*n* and the first connection portion 130*a* (Source) and the capacitance $C_{BUF}$ between the channel portion 130*n* and the light shielding layer 111, not all gate voltages $V_{GS}$ are effectively applied to the channel portion 130*n*, and voltage loss can be generated.

When the light shielding layer 111 and the source electrode 161 are electrically connected to each other, the capacitance $C_{BUF}$ is additionally generated between the channel portion 130*n* and the light shielding layer 111, so that a lower capacitance $C_{CH}+C_{BUF}$ causing a voltage loss is increased. In more detail, when a voltage of the gate voltages $V_{GS}$, which is effectively applied to the channel portion 130*n*, is referred to as the effective gate voltage Veff in FIG. 12B, the effective gate voltage Veff can be obtained by the following Equation 2.

$$V_{eff}=[C_{GI}/(C_{GI}+C_{CH}+C_{BUF})]\times V_{GS} \quad \text{[Equation 2]}$$

Referring to the Equation 2, a denominator value of the Equation 2 is increased due to the capacitance $C_{BUF}$ formed between the channel portion 130*n* and the light shielding layer 111. Therefore, when the capacitance $C_{BUF}$ between the channel portion 130*n* and the light shielding layer 111 is increased, the effective gate voltage Veff is reduced, whereby the increase rate of the drain-source current $I_{DS}$ in the thin film transistor 100 is reduced. As a result, the s-factor is increased.

Referring to the Equation 2, the capacitance $C_{BUF}$ between the channel portion 130*n* and the light shielding layer 111 can be increased to increase the s-factor of the thin film transistor 100. A method for increasing the capacitance $C_{BUF}$ between the channel portion 130*n* and the light shielding layer 111 includes reducing a thickness of the buffer layer 120. However, when the thickness of the buffer layer 120 is reduced, the channel portion 130*n* of the thin film transistor 100 can be damaged by hydrogen, oxygen or moisture, and the ON-current of the thin film transistor 100 is reduced.

According to one embodiment of the present disclosure, because the channel portion 130*n* includes the first overlap area OA1 and the first non-overlap area NOA1 together, the s-factor of the thin film transistor 100 can be increased even though the thickness of the buffer layer 120 is not reduced, and at the same time the ON-current of the thin film transistor 100 can be also increased.

Figure 2:
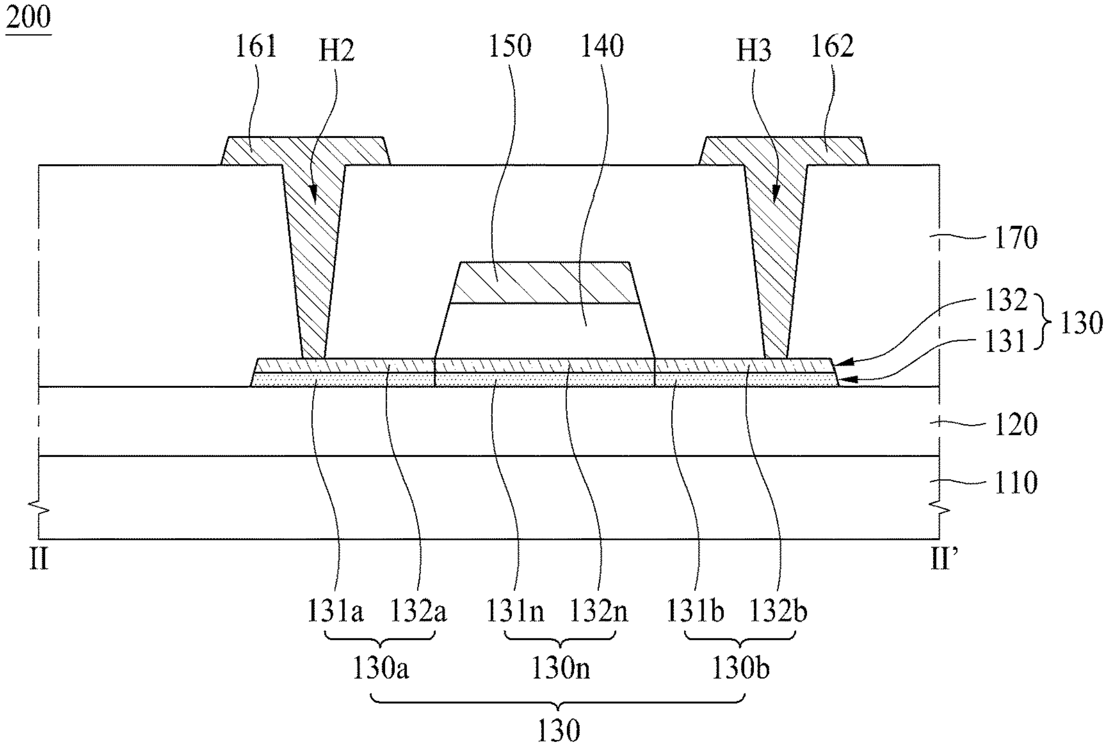
FIG. 2 is a cross-sectional view illustrating a thin film transistor according to another embodiment of the present disclosure.

Next, FIG. 2 is a cross-sectional view illustrating a thin film transistor 200 according to another embodiment of the present disclosure. In particular, FIG. 2 corresponds to a cross-section taken along line II-II' of FIG. 1A. Referring to FIG. 2, the gate insulating layer 140 can be patterned without being formed on the entire surface of the substrate 110. For example, as shown in FIG. 2, the gate insulating layer 140 can be patterned in the same planar shape as that of the gate electrode 150.

Figure 3A:
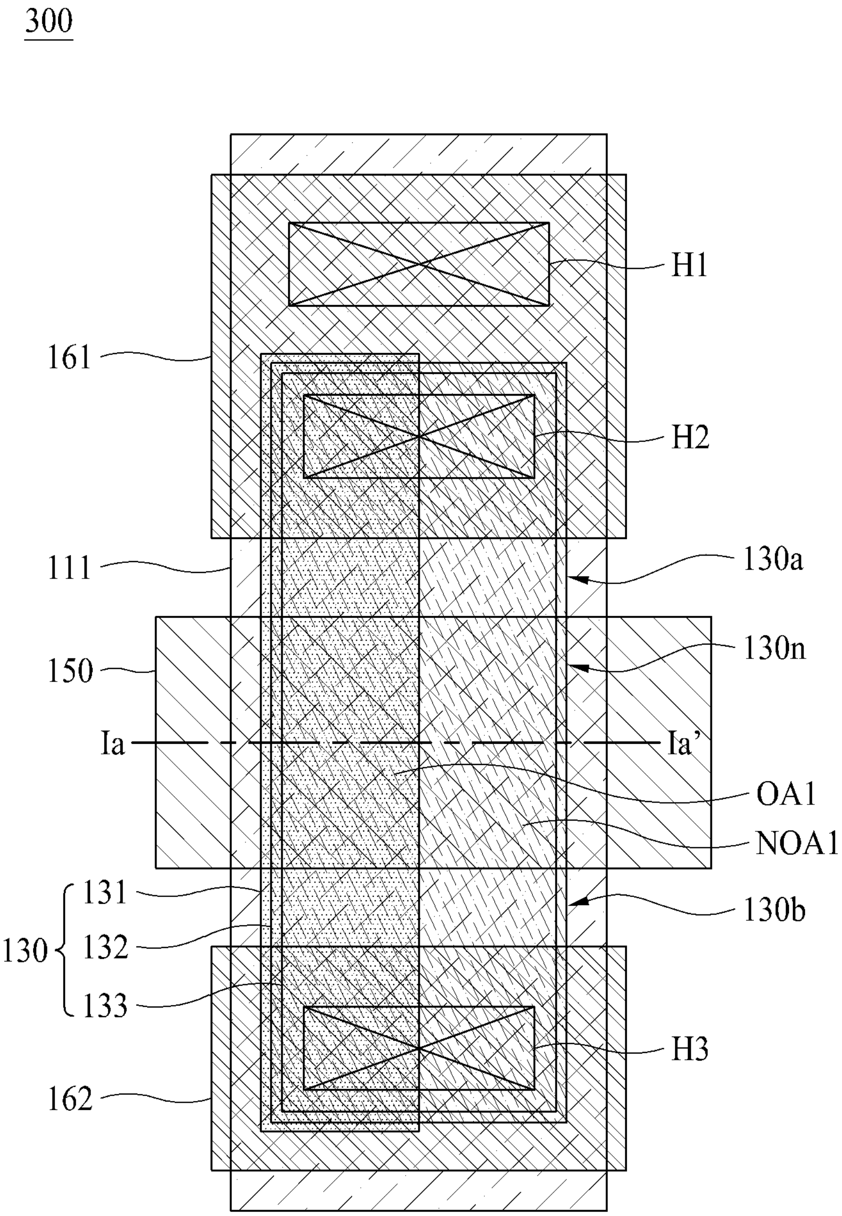
FIG. 3A is a plan view illustrating a thin film transistor according to still another embodiment of the present disclosure, and 3B is a cross-sectional view taken along line Ia-la' of FIG. 3A.
Figure 3B:
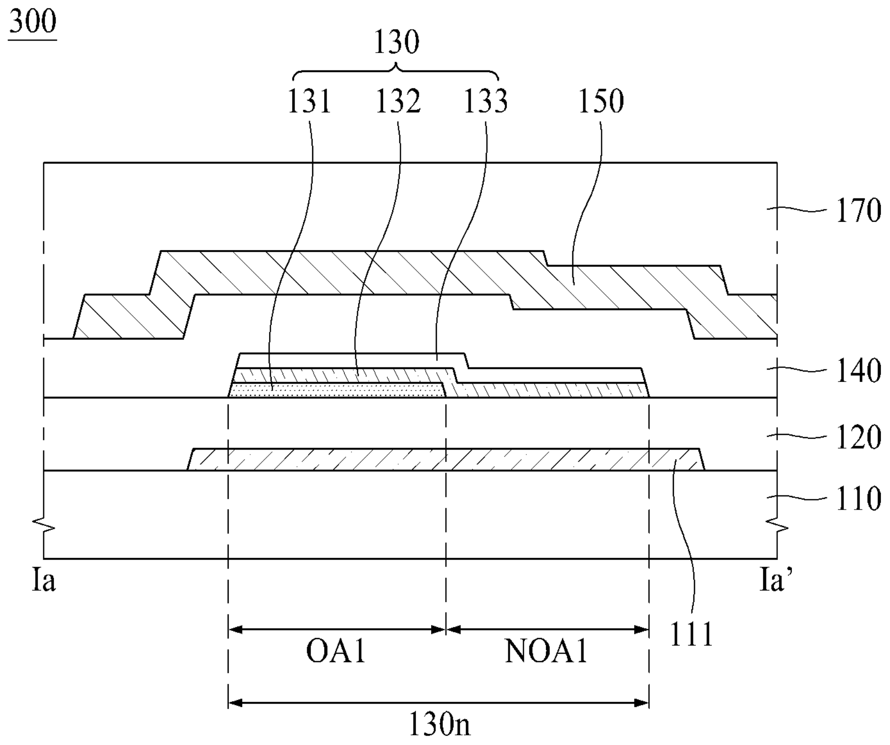

In addition, FIG. 3A is a plan view illustrating a thin film transistor 300 according to still another embodiment of the present disclosure, and FIG. 3B is a cross-sectional view taken along line Ia-la' of FIG. 3A. Referring to FIGS. 3A and 3B, the active layer 130 can further include a third active layer 133 on the second active layer 132. The third active layer 133 can be extended from the first connection portion 130*a* to the second connection portion 130*b* in the channel portion 130*n*. The third active layer 133 can also be also disposed in the first connection portion 130*a* and the second connection portion 130*b*.

Further, the third active layer 133 can protect the second active layer 132. To protect the second active layer 132, the third active layer 133 can be made of an oxide semiconductor material having an excellent stability. The third active layer 133 can also serve as a protective layer for protecting the second active layer 132.

In addition, the third active layer 133 can have a mobility smaller than that of the third active layer 133. The second active layer 132 can have a mobility greater than that of the third active layer 133 as much as two times or more. In more detail, the second active layer 132 can have a mobility of 2 to 5 times as compared with the third active layer 133. The third active layer 133 can have a mobility of 5 $cm^2/V$'s to 25 $cm^2/V{\cdot}s$. In more detail, the third active layer 133 can have a mobility of 5 $cm^2/V{\cdot}s$ to 15 $cm^2/V{\cdot}s$, or can have mobility of about 10 $cm^2/V{\cdot}s$.

Further, the second active layer 132 can have a mobility greater than that of the third active layer 133 as much as 10 $cm^2/V{\cdot}s$ to 40 $cm^2/V{\cdot}s$. The second active layer 132 can also have a mobility greater than that of the third active layer 133 as much as 10 $cm^2/V{\cdot}s$ to 30 $cm^2/V{\cdot}s$, 10 $cm^2/V{\cdot}s$ to 20 $cm^2/V{\cdot}s$, or 20 $cm^2/V{\cdot}s$ to 30 $cm^2/V{\cdot}s$.

The third active layer 133 can include at least one of, for example, an IGZO(InGaZnO)-based oxide semiconductor material, a GZO(GaZnO)-based oxide semiconductor material, an IGO(InGaO)-based oxide semiconductor material, or a GZTO(GaZnSnO)-based oxide semiconductor material. When the oxide semiconductor material constituting the third active layer 133 includes gallium (Ga) and indium (In), a concentration of gallium (Ga) is set to be higher than that of indium (In) based on the number of moles [Ga concentration>In concentration].

Thus, with the third active layer 133, the second active layer 132, which is an intermediate layer in the manufacturing process, can be effectively protected. For example, in the manufacturing process, the first active layer 131 can protect the second active layer 132, which is an intermediate layer, from gas, for example, hydrogen (H), moisture ($H_2O$), oxygen ($O_2$), etc. generated from the buffer layer 120 therebelow or another insulating layer, and the third active layer 133 can protect the second active layer 132, which is an intermediate layer, from an etching solution used during a patterning process or gas, for example, hydrogen (H), moisture ($H_2O$), oxygen ($O_2$), etc. generated from an upper insulating layer, for example, the gate insulating layer 140, the interlayer insulating layer 170, etc.

Referring to FIGS. 3A and 3B, the third active layer 133 can be disposed in the first overlap area OA1 and the first non-overlap area NOA1. The third active layer 133 can be disposed to cover the entire upper surface of the second active layer 132, but the present disclosure is not limited thereto, and the third active layer 133 can cover a portion of the upper surface of the second active layer 132.

Referring to FIGS. 3A and 3B, because the third active layer 133 is disposed in the first non-overlap area NOA1 and also serves as a protective layer for protecting the second active layer 132, an effect of increasing the carrier due to the third active layer 133 is not significant. Therefore, an s-factor of the thin film transistor 300 can be maintained at a high level.

Figure 4A:
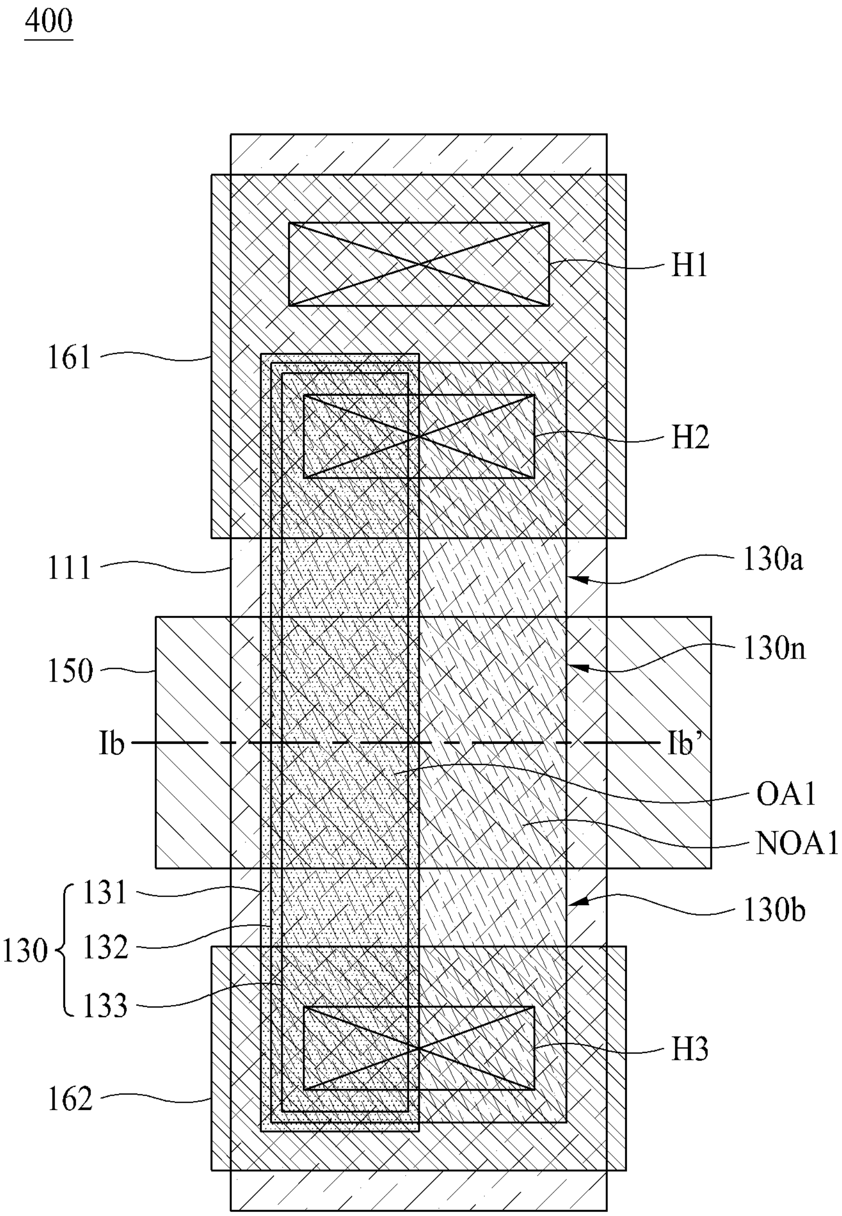
FIG. 4A is a plan view illustrating a thin film transistor 400 according to still another embodiment of the present disclosure.
Figure 4B:
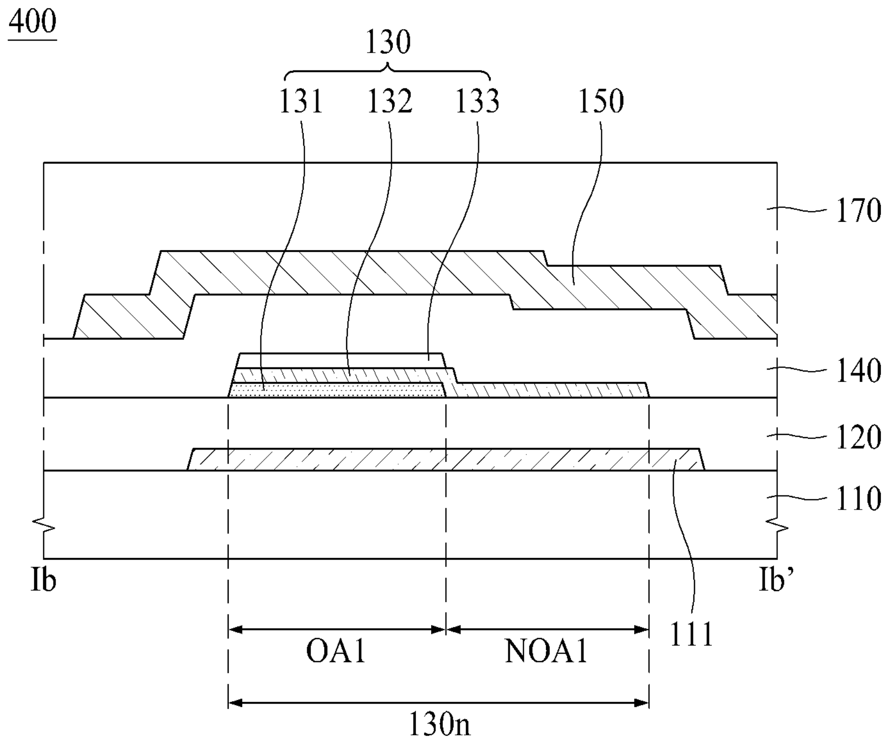
FIG. 4B is a cross-sectional view taken along line Ib-Ib' of FIG. 4A.

Next, FIG. 4A is a plan view illustrating a thin film transistor 400 according to still another embodiment of the present disclosure, and FIG. 4B is a cross-sectional view taken along line Ib-Ib' of FIG. 4A. Referring to FIGS. 4A and 4B, the active layer 130 can include a third active layer 133 on the second active layer 132, and the third active layer 133 can be disposed on a portion of the upper surface of the second active layer 132. In more detail, the third active layer 133 is not disposed in the first non-overlap area NOA1 and is disposed only in the first overlap area OA1.

The third active layer 133 is disposed in the first overlap area OA1, so that the upper portion of the second active layer 132 can be effectively protected in at least the first overlap area OA1. In addition, the electron carrier of the first overlap area OA1 can be increased due to the carrier included in the third active layer 133. In a structural aspect, a thickness of the first overlap area OA1 is increased due to the third active layer 133, whereby the physical stability of the first overlap area OA1 can be improved. As a result, the stability of the thin film transistor 100 can be improved, and the ON-current of the thin film transistor 100 can be improved by the first overlap area OA1. On the other hand, as the third active layer 133 is not disposed in the first non-overlap area NOA1, the carrier of the first non-overlap area NOA1 is not increased. As a result, an s-factor of the thin film transistor 400 can be maintained at a high level.

Figure 5A:
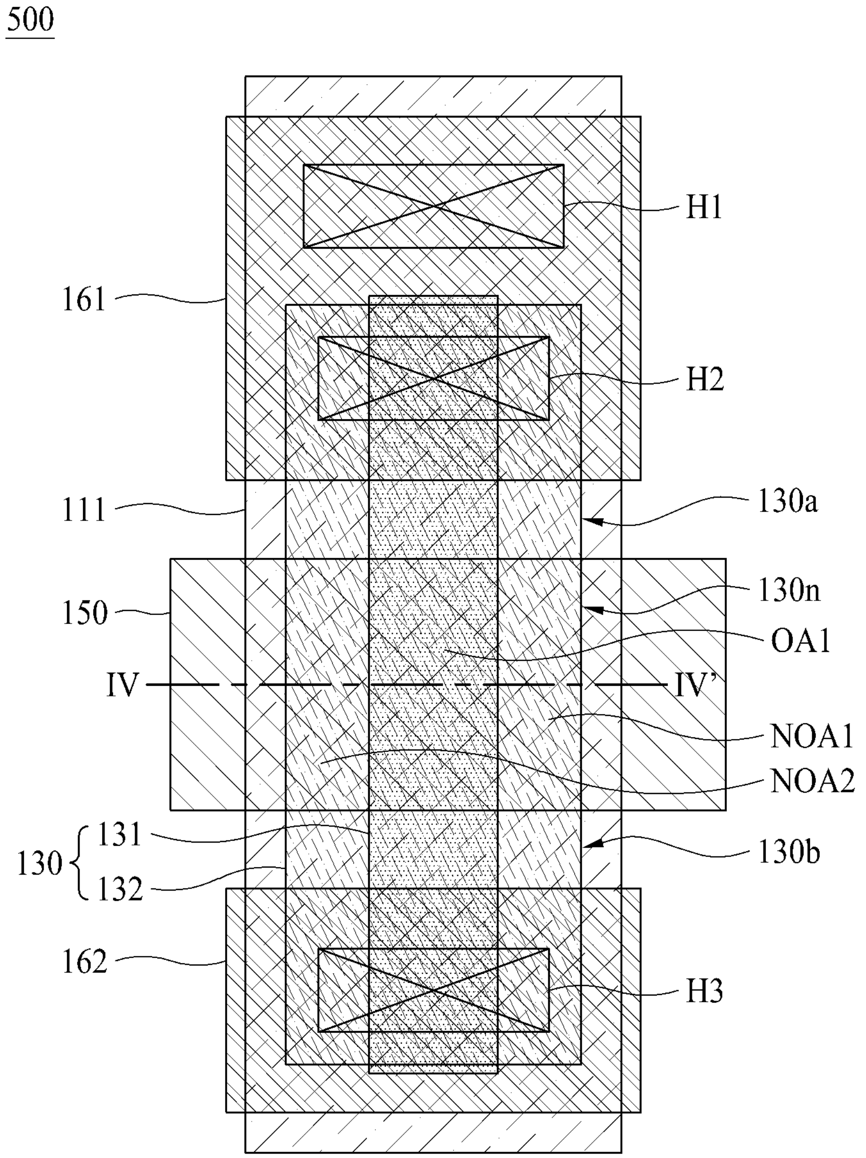
FIG. 5A is a plan view illustrating a thin film transistor according to still another embodiment of the present disclosure, and 5B is a cross-sectional view taken along line IV-IV' of FIG. 5A.
Figure 5B:
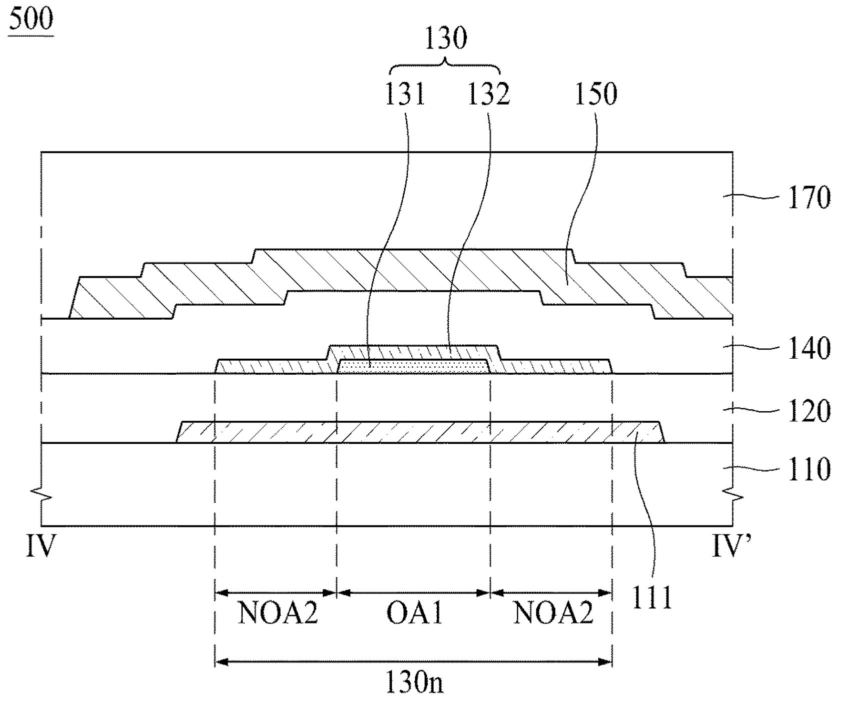

Next, FIG. 5A is a plan view illustrating a thin film transistor 500 according to further still another embodiment of the present disclosure, and FIG. 5B is a cross-sectional view taken along line IV-IV' of FIG. 5A. The thin film transistor 500 of FIG. 5A further includes a second non-overlap area NOA2 as compared with the thin film transistor 100 of FIG. 1A.

Referring to FIGS. 5A and 5B, the channel portion 130*n* can further include a second non-overlap area NOA in which the first active layer 131 and the second active layer 132 do not overlap each other based on the plan view. The second non-overlap area NOA2 can be spaced apart from the first non-overlap area NOA1 and extend from the first connection portion 130*a* to the second connection portion 130*b*. The first non-overlap area NOA1 and the second non-overlap area NOA2 can be disposed to be spaced apart from each other with the first overlap area OA1 interposed therebetween.

As shown, the first active layer 131 may not be disposed in the second non-overlap area NOA2. Further, the second non-overlap area NOA2 includes a carrier (electron carrier)

having a concentration lower than that of the first overlap area OA1 in the same manner as the first non-overlap area NOA1. Therefore, the second non-overlap area NOA2 can serve to increase the s-factor of the thin film transistor 100 in the same manner as the first non-overlap area NOA1.

Figure 6:
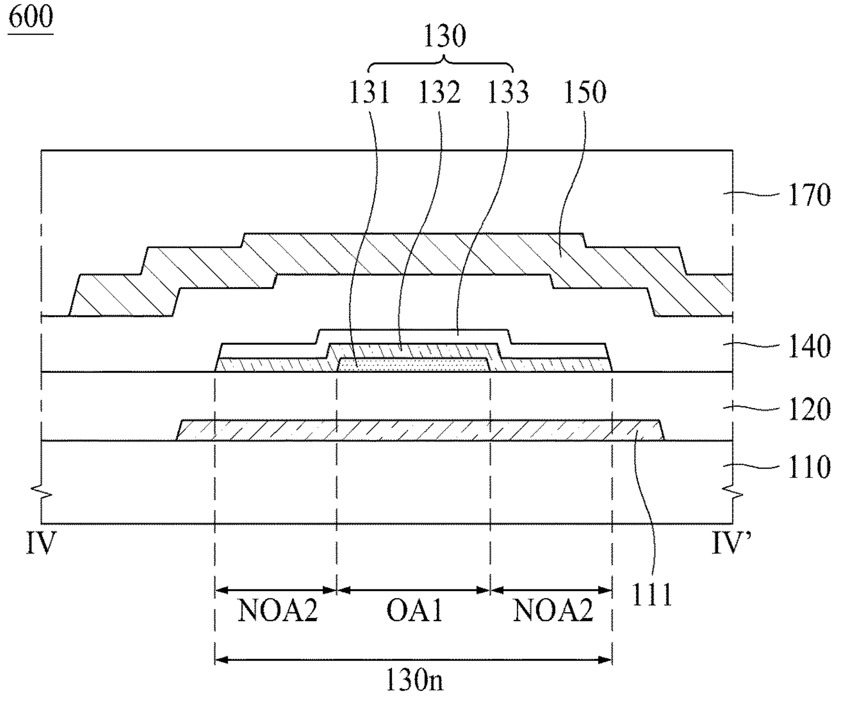
FIG. 6 is a cross-sectional view illustrating a thin film transistor according to further still another embodiment of the present disclosure.

Next, FIG. 6 is a cross-sectional view illustrating a thin film transistor 600 according to further still another embodiment of the present disclosure. In particular, FIG. 6 is a cross-sectional view taken along line IV-IV' of FIG. 5A.

Referring to FIG. 6, the active layer 130 can further include a third active layer 133 on the second active layer 132. The third active layer 133 can be extended from the first connection portion 130*a* to the second connection portion 130*b* in the channel portion 130*n*. The third active layer 133 can also be disposed in the first connection portion 130*a* and the second connection portion 130*b*.

In addition, the third active layer 133 can be disposed in the first overlap area OA1, the first non-overlap area NOA1 and the second non-overlap area NOA2. The third active layer 133 can also be disposed to cover the entire upper surface of the second active layer 132, but the present disclosure is not limited thereto, and the third active layer 133 can cover a portion of the upper surface of the second active layer 132.

Referring to FIG. 6, the third active layer 133 is disposed in the first non-overlap area NOA1 and the second non-overlap area NOA2, but an effect of increasing the carrier due to the third active layer 133 is not significant. Therefore, an s-factor of the thin film transistor 600 can be maintained at a high level.

Figure 7A:
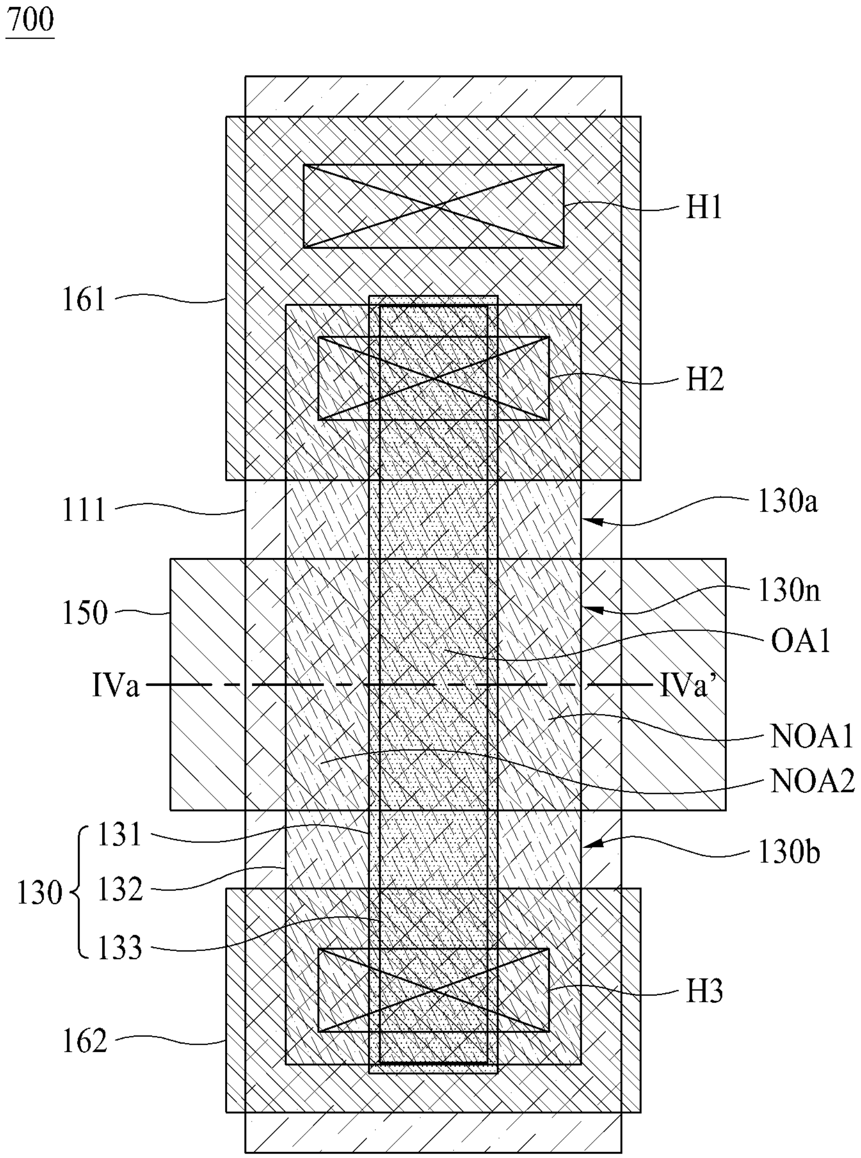
FIG. 7A is a plan view illustrating a thin film transistor 700 according to further still another embodiment of the present disclosure.
Figure 7B:
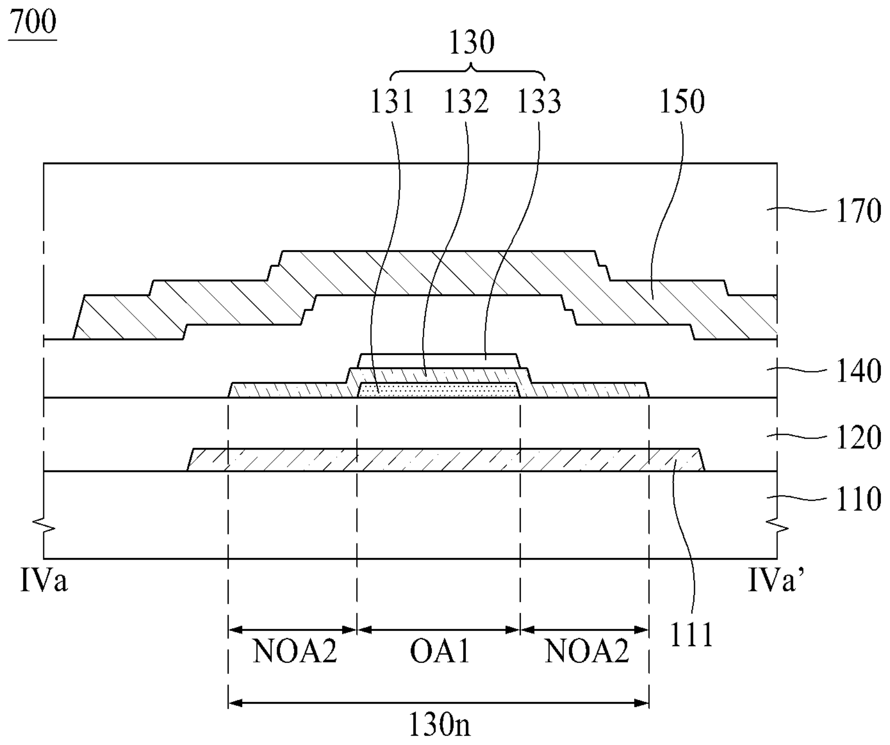
FIG. 7B is a cross-sectional view taken along line IVa-IVa' of FIG. 7A.

Next, FIG. 7A is a plan view illustrating a thin film transistor 700 according to further still another embodiment of the present disclosure, and FIG. 7B is a cross-sectional view taken along line IVa-IVa' of FIG. 7A. Referring to FIGS. 7A and 7B, the active layer 130 can include a third active layer 133 on the second active layer 132, and the third active layer 133 can be disposed on a portion of the upper surface of the second active layer 132.

In more detail, the third active layer 133 can be disposed in the first overlap area OA1. The third active layer 133 may not be disposed in the first non-overlap area NOA1. In addition, the third active layer 133 may not be disposed in the second non-overlap area NOA2. The third active layer 133 is not disposed in the second non-overlap area NOA2, so that a carrier of the second non-overlap area NOA2 may not be increased. As a result, an s-factor of the thin film transistor 700 can be maintained at a high level.

Figure 8A:
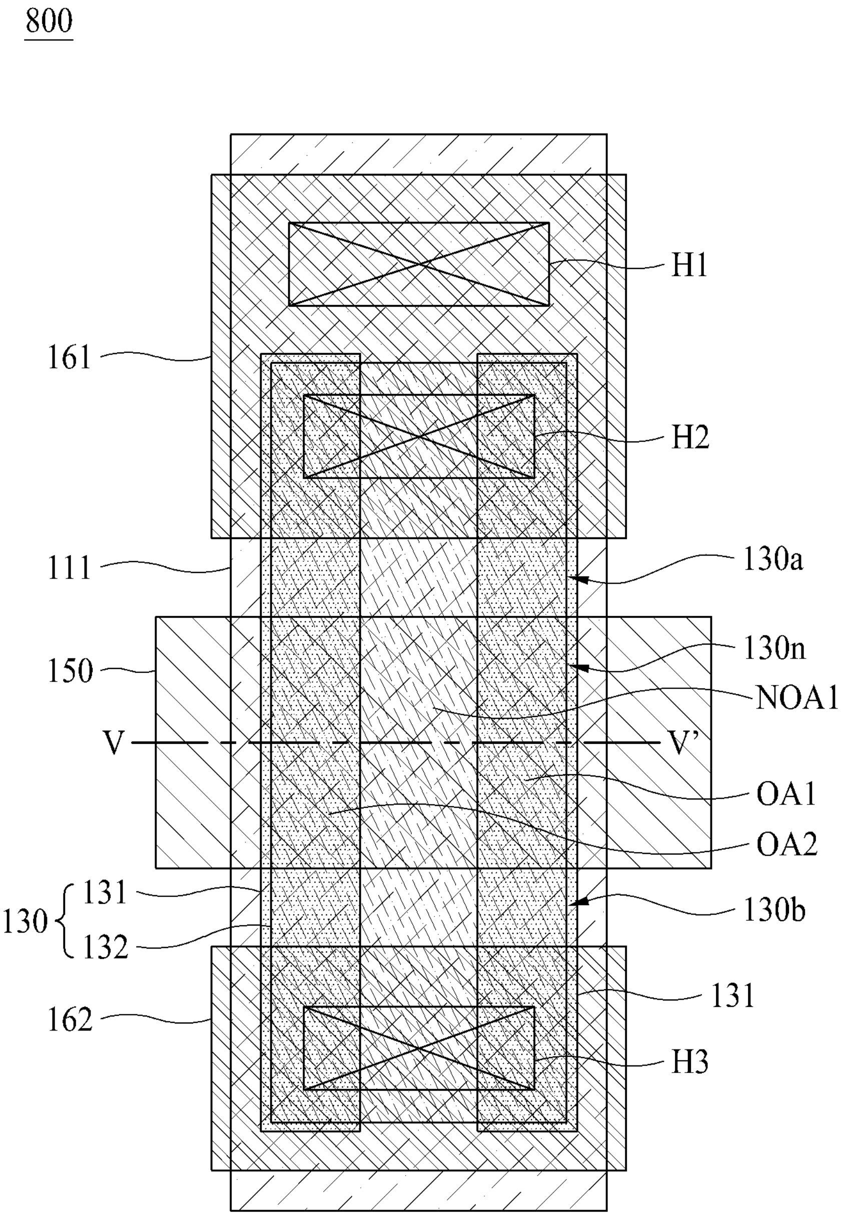
FIG. 8A is a plan view illustrating a thin film transistor according to further still another embodiment of the present disclosure, and 8B is a cross-sectional view taken along line V-V' of FIG. 8A.
Figure 8B:
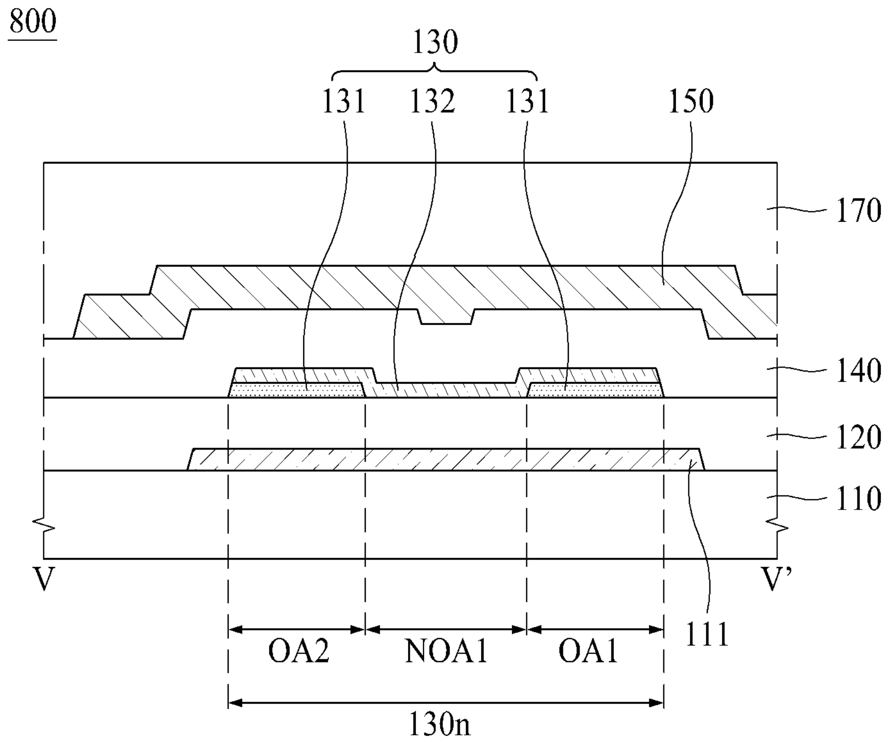

Next, FIG. 8A is a plan view illustrating a thin film transistor 800 according to further still another embodiment of the present disclosure, and FIG. 8B is a cross-sectional view taken along the line V-V' of FIG. 8A. The thin film transistor 800 of FIG. 8A further includes a second overlap area OA2 as compared with the thin film transistor 100 of FIG. 1A.

Referring to FIGS. 8A and 8B, the channel portion 130*n* can further include a second overlap area OA2 in which the first active layer 131 and the second active layer 132 overlap each other based on the plan view. The second overlap area OA2 can be spaced apart from the first overlap area OA1 and extend from the first connection portion 130*a* to the second connection portion 130*b*. In addition, the first overlap area OA1 and the second overlap area OA2 can be spaced apart from each other with the first non-overlap area NOA1 interposed therebetween.

According to one embodiment of the present disclosure, the first active layer 131 is not disposed in the first non-overlap area NOA1, and can be disposed in the first overlap area OA1 and the second overlap area OA2. Also, the second overlap area OA2 includes a carrier (electron carrier) of a concentration higher than that of the first non-overlap area NOA1 in the same manner as the first overlap area OA1. Therefore, the second overlap area OA2 can serve to improve the ON-current of the thin film transistor 100 in the same manner as the first overlap area OA1.

Figure 9A:
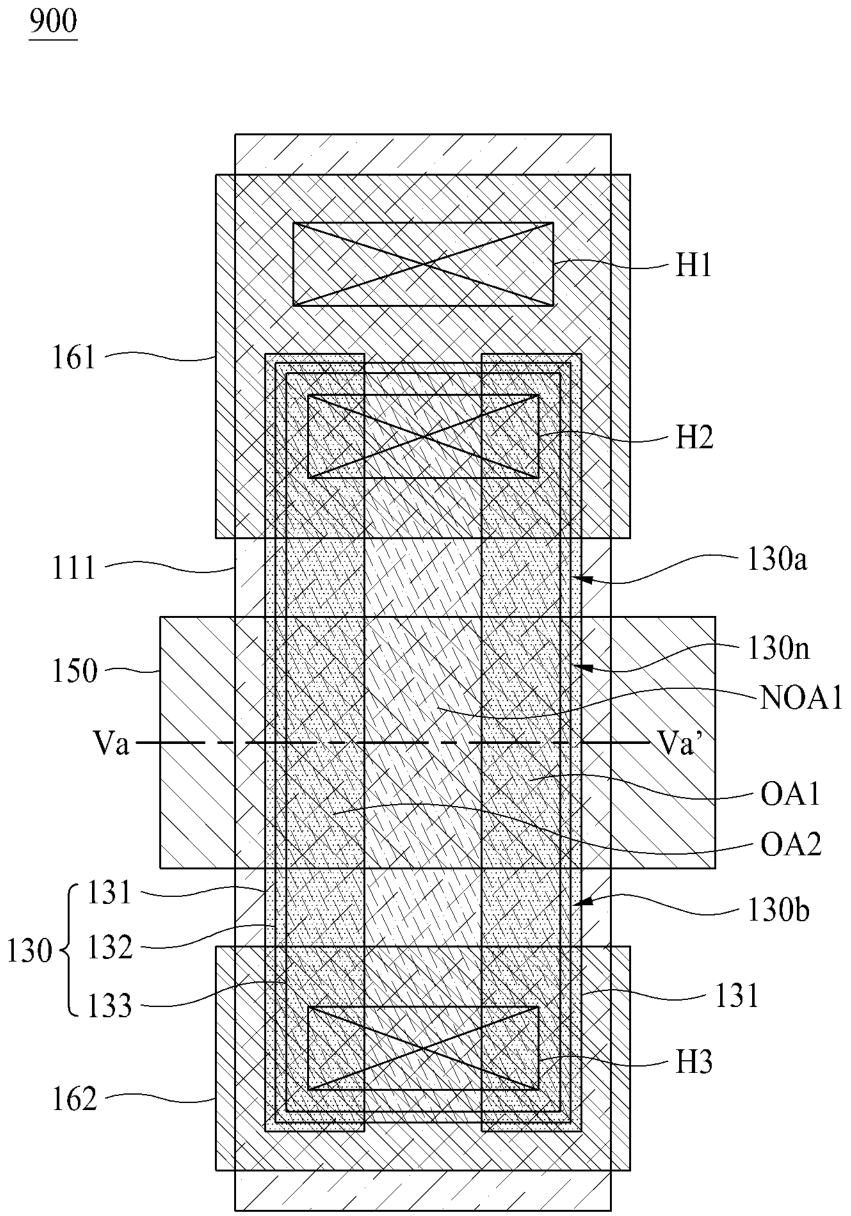
FIG. 9A is a plan view illustrating a thin film transistor 900 according to further still another embodiment of the present disclosure.
Figure 9B:
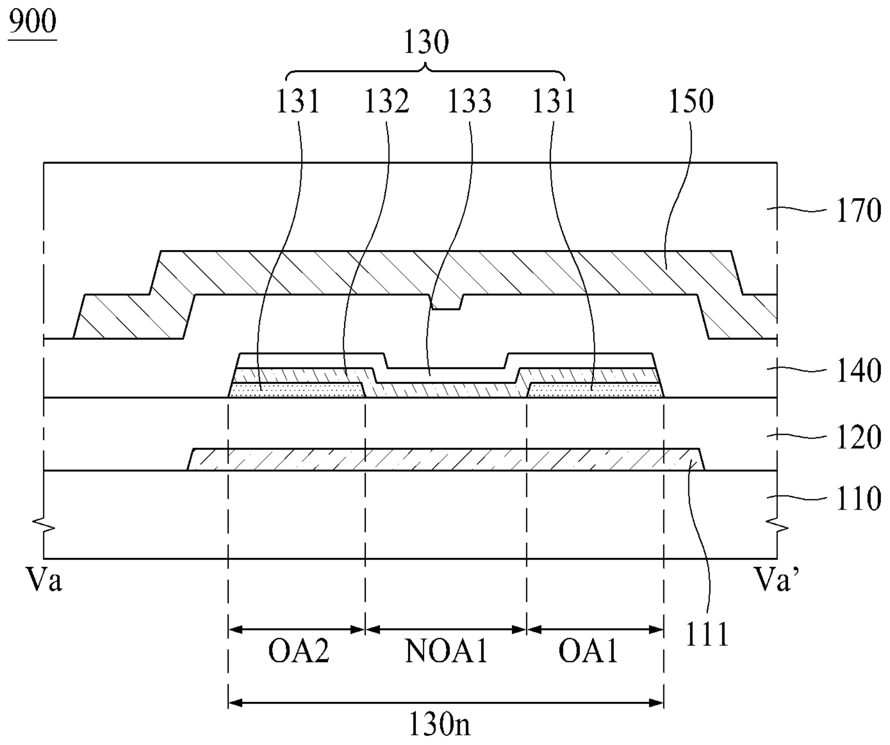
FIG. 9B is a cross-sectional view taken along line Va-Va' of FIG. 9A.

FIG. 9A is a plan view illustrating a thin film transistor 900 according to further still another embodiment of the present disclosure, and FIG. 9B is a cross-sectional view taken along line Va-Va' of FIG. 9A. Referring to FIGS. 9A and 9B, the active layer 130 can further include a third active layer 133 on the second active layer 132. As shown, the third active layer 133 can be extended from the first connection portion 130*a* to the second connection portion 130*b* in the channel portion 130*n*. The third active layer 133 can be also disposed in the first connection portion 130*a* and the second connection portion 130*b*.

Further, the third active layer 133 can be disposed in the first overlap area OA1, the first non-overlap area NOA1 and the second overlap area OA2. Also, the third active layer 133 can be disposed to cover the entire upper surface of the second active layer 132, but the present disclosure is not limited thereto, and the third active layer 133 can cover a portion of the upper surface of the second active layer 132.

Referring to FIGS. 9A and 9B, the third active layer 133 is disposed in the first non-overlap area NOA1, but the effect of increasing the carrier due to the third active layer 133 is not significant. Therefore, an s-factor of the thin film transistor 900 can be maintained at a high level.

Figure 10A:
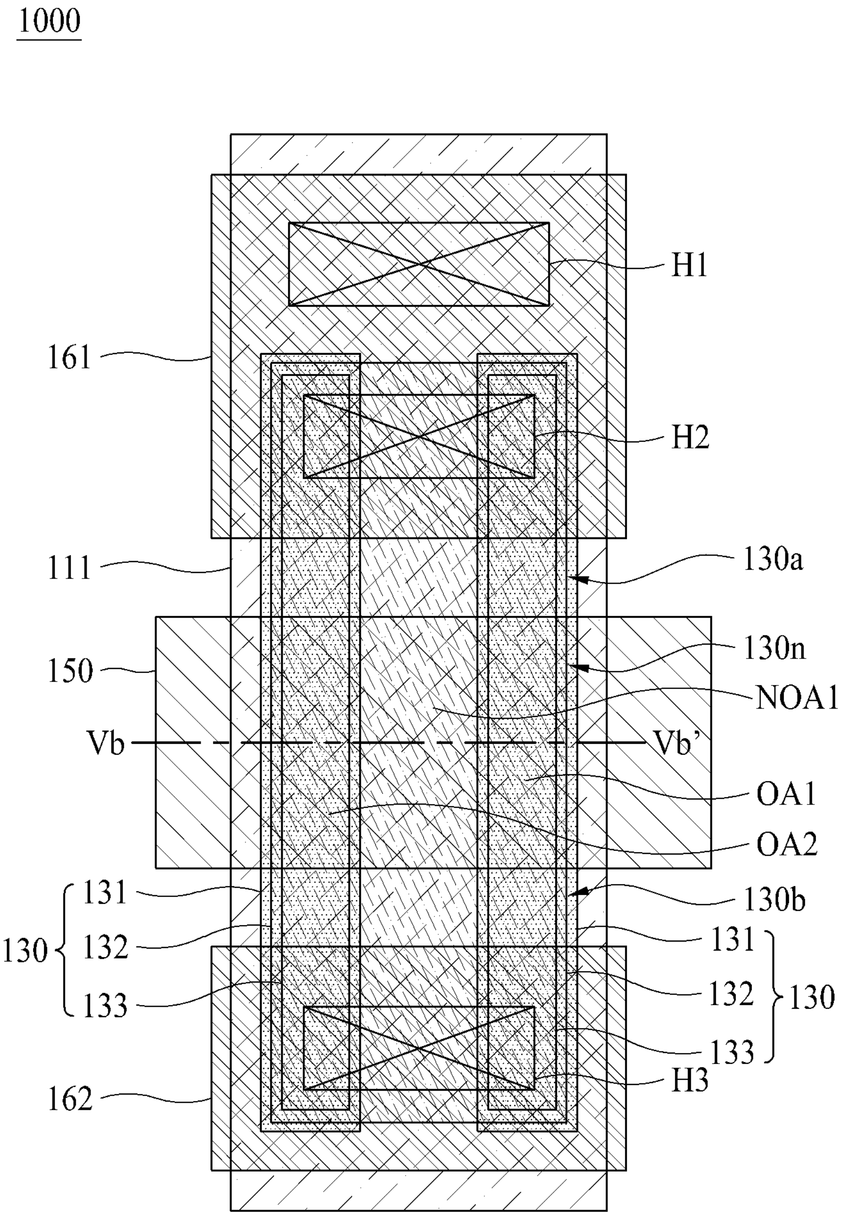
FIG. 10A is a plan view illustrating a thin film transistor 1000 according to further still another embodiment of the present disclosure.
Figure 10B:
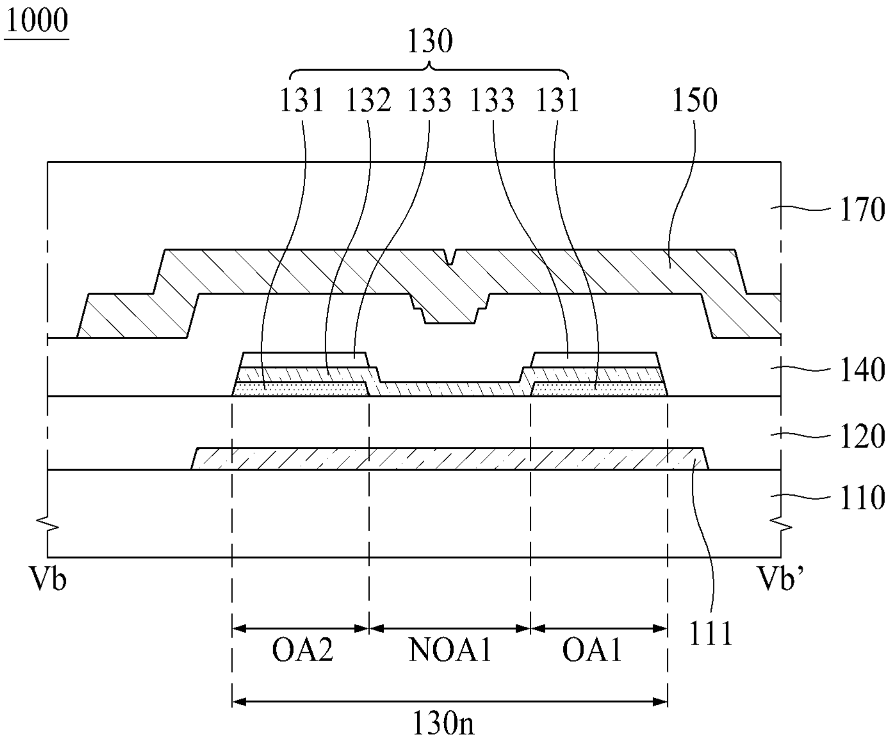
FIG. 10B is a cross-sectional view taken along the line Vb-Vb' of FIG. 10A.

Next, FIG. 10A is a plan view illustrating a thin film transistor 1000 according to further still another embodiment of the present disclosure, and FIG. 10B is a cross-sectional view taken along the line Vb-Vb' of FIG. 10A. Referring to FIGS. 10A and 10B, the active layer 130 can include a third active layer 133 on the second active layer 132, and the third active layer 133 can be disposed on a portion of the upper surface of the second active layer 132. In more detail, the third active layer 133 can be disposed in the first overlap area OA1 and the second overlap area OA2. The third active layer 133 may not be disposed in the first non-overlap area NOA1.

As the third active layer 133 is not disposed in the first non-overlap area NOA1, the carrier of the first non-overlap area NOA1 is not increased. As a result, an s-factor of the thin film transistor 1000 can be maintained at a high level.

As described previously, FIGS. 11A and 11B are schematic views illustrating a gate voltage applied to a thin film transistor in which the light shielding layer 111 is not disposed, and FIGS. 12A and 12B are schematic views illustrating a gate voltage applied to a thin film transistor in which the light shielding layer 111 is disposed.

As described previously, FIG. 13A is a graph illustrating a relation between an s-factor and an ON-current. In addition, FIG. 13B is a graph illustrating threshold voltages of thin film transistors. Referring to FIG. 13A, in the thin film transistor in which the light shielding layer 111 is disposed, when the thickness of the buffer layer BUF 120 is increased or the thickness of the gate insulating layer GI 140 is reduced, the ON-current of the thin film transistor can be increased, but the s-factor can be reduced.

On the other hand, in the thin film transistor in which the light shielding layer 111 is disposed, when the thickness of the buffer layer BUF 120 is reduced or the thickness of the gate insulating layer GI 140 is increased, the s-factor of the thin film transistor can be increased, but the ON-current can be reduced.

FIG. 13B illustrates threshold voltages of various thin film transistors. In FIG. 13B, "Embodiment 1" is a threshold voltage graph for the thin film transistor 100 of FIG. 1, "Comparative Example 1" is a threshold voltage graph of a thin film transistor in which the thickness of the gate insulating layer 140 is reduced to improve the ON-Current, and "Comparative Example 2" is a threshold voltage graph of a thin film transistor in which the thickness of the gate insulating layer 140 is increased to improve the s-factor.

Referring to the "Comparative Example 1," when the thickness of the gate insulating layer 140 is reduced, the ON-current of the thin film transistor is improved but the s-factor is reduced. In addition, referring to the "Comparative Example 2," when the thickness of the gate insulating layer 140 is increased, the s-factor of the thin film transistor is increased but the ON-current is reduced. On the other hand, the thin film transistor of the Embodiment 1 according to embodiment 1 of the present disclosure has excellent ON-current characteristics while having a large s-factor.

Hereinafter, the display apparatus comprising the above-described thin film transistors 100, 200, 300, 400, 500, 600, 700, 800, 900 and 1000 will be described in detail. In particular, FIG. 14 is a schematic view illustrating a display apparatus 1100 according to further still another embodiment of the present disclosure.

Figure 14:
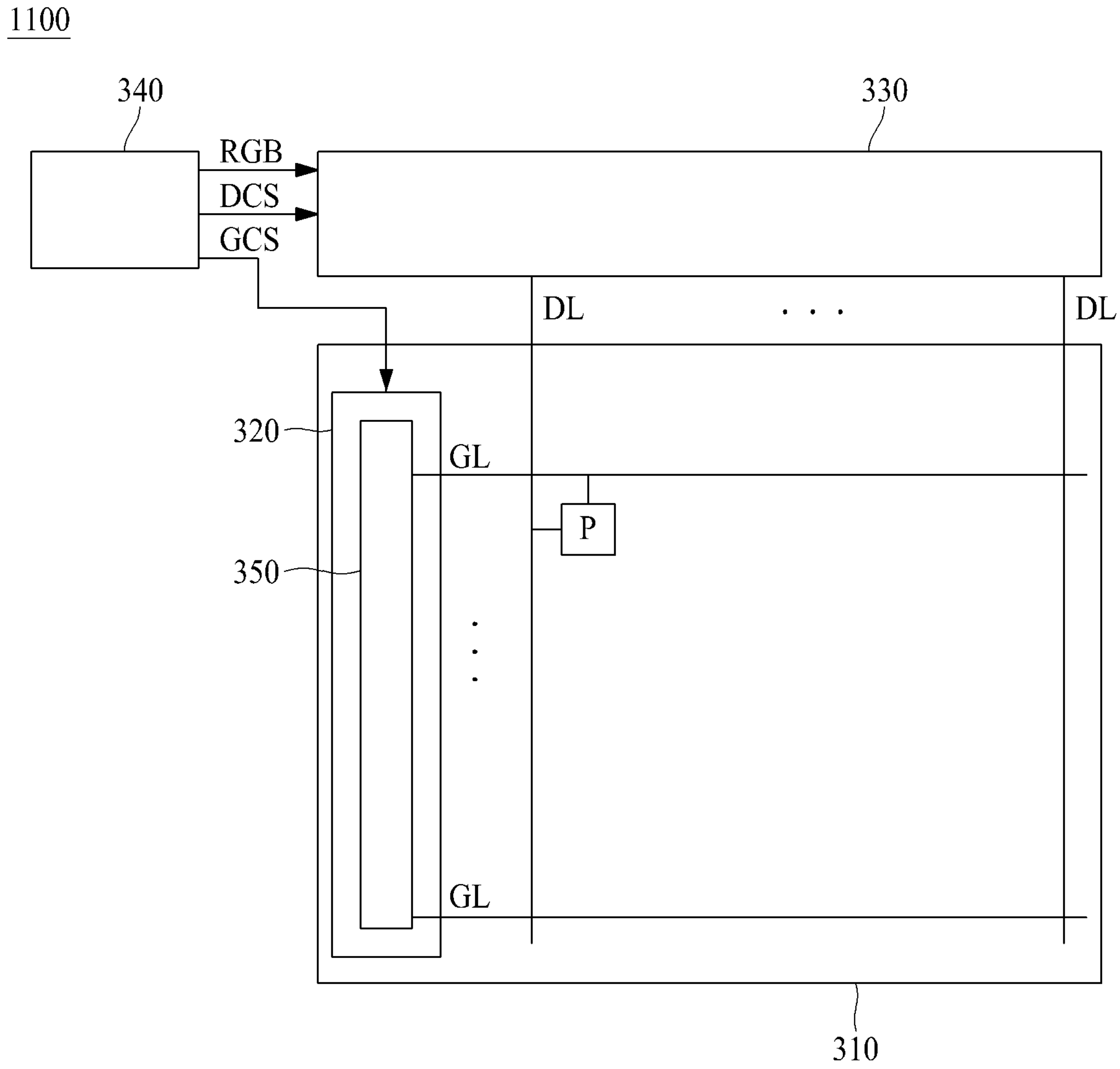
FIG. 14 is a schematic view illustrating a display apparatus according to another embodiment of the present disclosure.

As shown in FIG. 14, the display apparatus 1100 according to further still another embodiment of the present disclosure includes a display panel 310, a gate driver 320, a data driver 330 and a controller 340. Gate lines GL and data lines DL are disposed in the display panel 310, and pixels P are disposed in intersection areas of the gate lines GL and the data lines DL. An image is displayed by driving of the pixels P.

The controller 340 controls the gate driver 320 and the data driver 330. In addition, the controller 340 outputs a gate control signal GCS for controlling the gate driver 320 and a data control signal DCS for controlling the data driver 330 by using a signal supplied from an external system. Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register can be included in the gate control signal GCS. The data control signal DCS includes a source start pulse SSP, a source shift clock signal SSC, a source output enable signal SOE and a polarity control signal POL.

The data driver 330 supplies a data voltage to the data lines DL of the display panel 310. In more detail, the data driver 330 converts the image data RGB input from the controller 340 into an analog data voltage and supplies the data voltage to the data lines DL. The gate driver 320 may include a shift register 350.

In addition, the shift register 350 sequentially supplies gate pulses to the gate lines GL for one frame by using the start signal and the gate clock, which are transmitted from the controller 340. In this instance, one frame means a time period at which one image is output through the display panel 310. The gate pulse has a turn-on voltage capable of turning on a switching device (thin film transistor) disposed in the pixel P.

Also, the shift register 350 supplies a gate-off signal capable of turning off the switching device, to the gate line GL for the other period of one frame, at which the gate pulse is not supplied. Hereinafter, the gate pulse and the gate-off signal will be collectively referred to as a scan signal SS or Scan.

According to one embodiment of the present disclosure, the gate driver 320 can be packaged on the substrate 110. In this way, a structure in which the gate driver 320 is directly packaged on the substrate 110 will be referred to as a Gate In Panel (GIP) structure.

Figure 15:
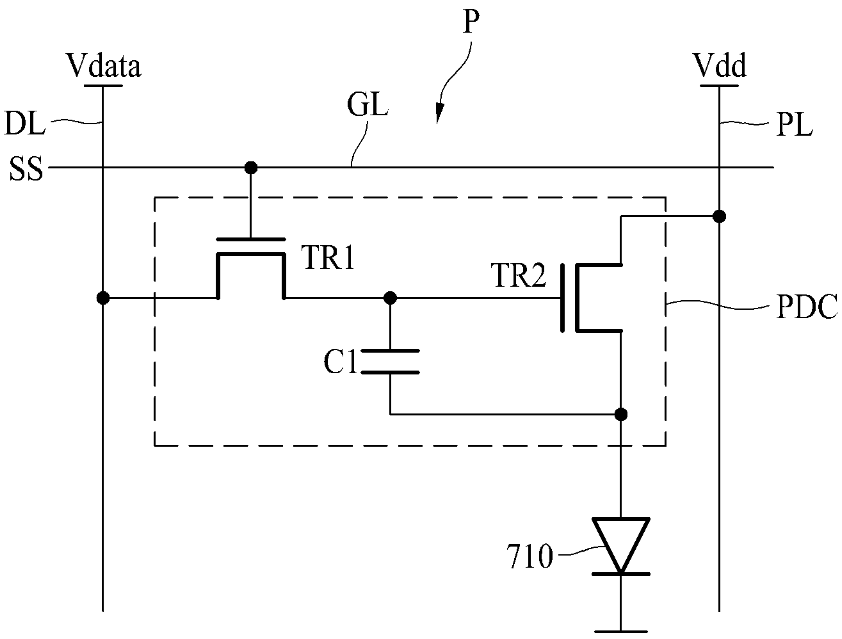
FIG. 15 is a circuit view illustrating any one pixel of FIG. 14.
Figure 16:
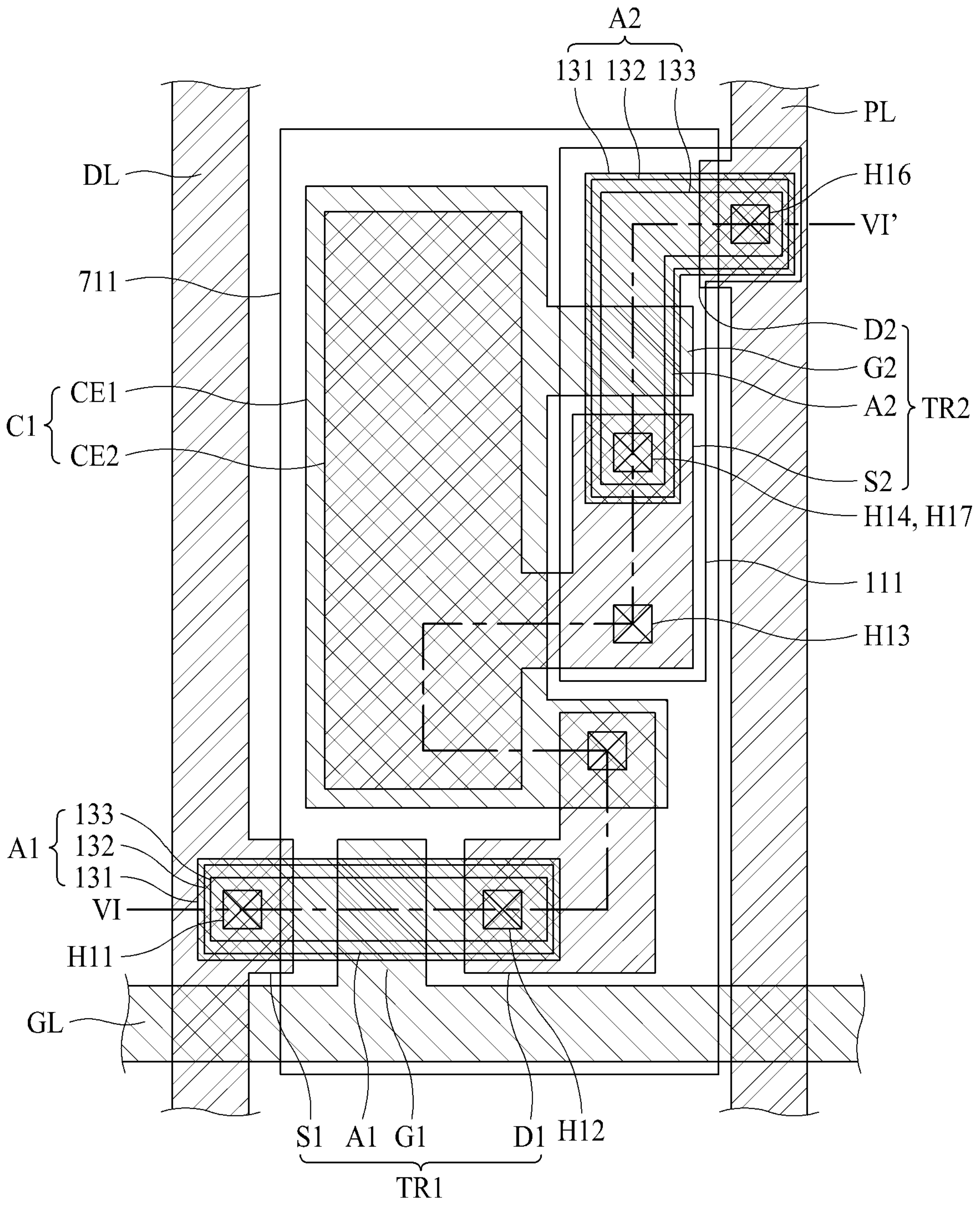
FIG. 16 is a plan view illustrating the pixel of FIG. 14.
Figure 17:
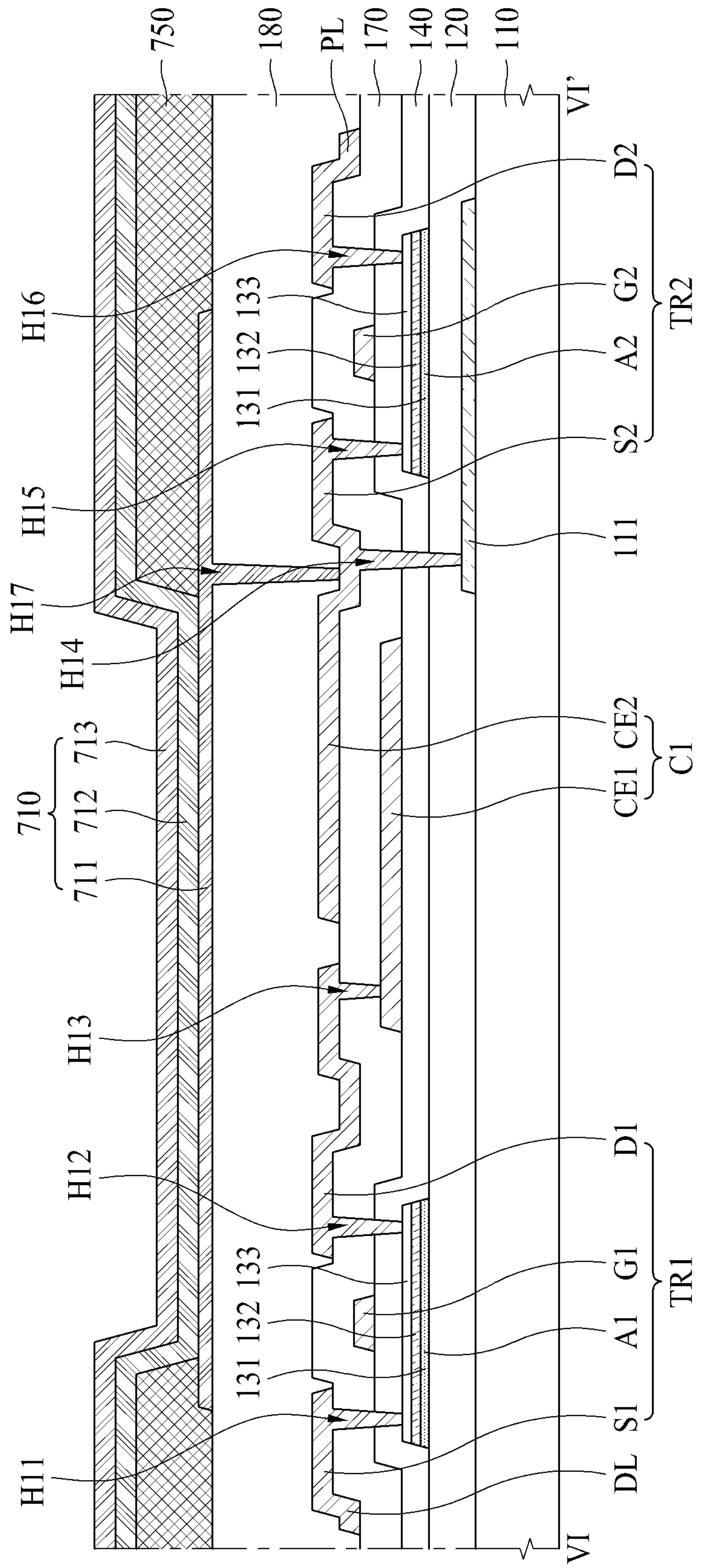
FIG. 17 is a cross-sectional view taken along line VI-VI' of FIG. 16.

Next, FIG. 15 is a circuit view illustrating any one pixel P of FIG. 14, FIG. 16 is a plan view illustrating a pixel P of FIG. 14, and FIG. 17 is a cross-sectional view taken along line VI-VI' of FIG. 16. The circuit view of FIG. 15 is an equivalent circuit view for the pixel P of the display apparatus 1100 that includes an organic light emitting diode (OLED) as a display device 710.

As shown, the pixel P includes a display device 710 and a pixel driving circuit PDC for driving the display device 710. The pixel driving circuit PDC of FIG. 15 includes a first thin film transistor TR1 that is a switching transistor and a second thin film transistor TR2 that is a driving transistor. For example, the thin film transistors 100, 200, 300, 400, 500, 600, 700, 800, 900 and 1000 described in the embodiments can be used as the second thin film transistor TR2. The thin film transistors 100, 200, 300, 400, 500, 600, 700, 800, 900 and 1000 described in the embodiments can be also used as the first thin film transistor TR1.

As shown, the first thin film transistor TR1 is connected to the gate line GL and the data line DL, and is turned on or off by the scan signal SS supplied through the gate line GL. The data line DL provides a data voltage Vdata to the pixel driving circuit PDC, and the first thin film transistor TR1 controls applying of the data voltage Vdata.

A driving power line PL provides a driving voltage Vdd to the display device 710, and the second thin film transistor TR2 controls the driving voltage Vdd. In addition, the driving voltage Vdd is a pixel driving voltage for driving the organic light emitting diode (OLED) that is the display device 710.

When the first thin film transistor TR1 is turned on by the scan signal SS applied from the gate driver 320 through the gate line GL, the data voltage Vdata supplied through the data line DL is supplied to a gate electrode G2 of the second thin film transistor TR2 connected with the display device 710. Further, the data voltage Vdata is charged in a first capacitor C1 formed between the gate electrode G2 and a source electrode S2 of the second thin film transistor TR2. The first capacitor C1 is a storage capacitor Cst.

The amount of a current supplied to the organic light emitting diode (OLED), which is the display device 710, through the second thin film transistor TR2 is controlled in accordance with the data voltage Vdata, whereby a gray scale of light emitted from the display device 710 can be controlled.

Referring to FIGS. 16 and 17, the first thin film transistor TR1 and the second thin film transistor TR2 are disposed on the substrate 110. The substrate 110 can be made of glass or plastic. Plastic having a flexible property, for example, polyimide (PI) can be used as the substrate 110.

The light shielding layer 111 is disposed on the substrate 110. Referring to FIGS. 16 and 17, the light shielding layer 111 is disposed only below the second thin film transistor TR2 that is a driving transistor, but the present disclosure is not limited thereto, and the light shielding layer 111 can be also disposed below the first thin film transistor TR1.

A buffer layer 120 is disposed on the light shielding layer 111. The buffer layer 120 is made of an insulating material, and protects active layers A1 and A2 from external moisture or oxygen. The active layer A1 of the first thin film transistor TR1 and the active layer A2 of the second thin film transistor TR2 are disposed on the buffer layer 120. The active layers A1 and A2 may include, for example, a first active layer 131, a second active layer 132 and a third active layer 133. The active layers A1 and A2 can have any one of the structures of FIGS. 3, 4, 6, 7, 9 and 10.

In addition, a gate insulating layer 140 is disposed on the active layers A1 and A2. The gate insulating layer 140 may cover entire upper surfaces of the active layers A1 and A2, or may cover only a portion of the active layers A1 and A2. The gate electrode G1 of the first thin film transistor TR1 and the gate electrode G2 of the second thin film transistor TR2 are disposed on the gate insulating layer 140. Also, a first capacitor electrode CE1 can be disposed on the gate insulating layer 140. The first capacitor electrode CE1 can be connected to the gate electrode G2 of the second thin film transistor TR2.

An interlayer insulating layer 170 is disposed on the gate electrodes G1 and G2 and the first capacitor electrode CE1. The data line DL, the driving power line PL, source electrodes S1 and S2 and drain electrodes D1 and D2 are disposed on the interlayer insulating layer 170. A portion of the data line DL can be extended to become the source electrode S1 of the first thin film transistor TR1. The source electrode S1 of the first thin film transistor TR1 can be connected to the active layer A1 of the first thin film transistor TR1 through a contact hole H11.

Referring to FIGS. 16 and 17, the drain electrode D1 of the first thin film transistor TR1 and the source electrode S2 of the second thin film transistor TR2 are disposed on the interlayer insulating layer 170. The drain electrode D1 of the first thin film transistor TR1 can be connected to the active layer A1 of the first thin film transistor TR1 through a contact hole H12. In addition, the drain electrode D1 of the first thin film transistor TR1 can be connected to the first capacitor electrode CE1 through a contact hole H13. As a result, the data voltage can be applied to the first capacitor electrode CE1 and the gate electrode G2 of the second thin film transistor TR2.

The source electrode S2 of the second thin film transistor TR2 can be connected to the light shielding layer 111 through one contact hole H14, and can be connected to the active layer A2 of the second thin film transistor TR2 through another contact hole H15. As a result, the light shielding layer 111 can be connected to the source electrode S2 of the second thin film transistor TR2.

In addition, the source electrode S2 of the second thin film transistor TR2 can be extended to become a second capacitor electrode CE2. The second capacitor electrode CE2 overlaps the first capacitor electrode CE1 to form the first capacitor C1. A portion of the driving power line PL can be extended to become the drain electrode D2 of the second thin film transistor TR2. The drain electrode D2 of the second thin film transistor TR2 can be connected to the active layer A2 of the second thin film transistor TR2 through a contact hole H16.

A planarization layer 180 is disposed on the data line DL, the driving power line PL, the source electrodes S1 and S2, the drain electrodes D1 and D2 and the second capacitor electrode CE2. The planarization layer 180 planarizes upper portions of the first thin film transistor TR1 and the second thin film transistor TR2 and protects the first thin film transistor TR1 and the second thin film transistor TR2.

Further, a first electrode 711 of the display device 710 is disposed on the planarization layer 180. The first electrode 711 of the display device 710 contacts the source electrode S2 of the second thin film transistor TR2 and the second capacitor electrode CE2 through a contact hole H17 formed in the planarization layer 180.

Also, a bank layer 750 is disposed at an edge of the first electrode 711. The bank layer 750 defines a light emission area of the display device 710. An organic light emitting layer 712 is further disposed on the first electrode 711, and a second electrode 713 is disposed on the organic light emitting layer 712. Therefore, the display device 710 is completed. The display device 710 shown in FIG. 17 is an organic light emitting diode (OLED). Therefore, the display apparatus 1100 according to one embodiment of the present disclosure is an organic light emitting display apparatus.

According to another embodiment of the present disclosure, the second thin film transistor TR2 can have a large s-factor. The second thin film transistor TR2 can be used as a driving transistor to improve a gray scale representation capability of the display apparatus 1100.

Figure 18:
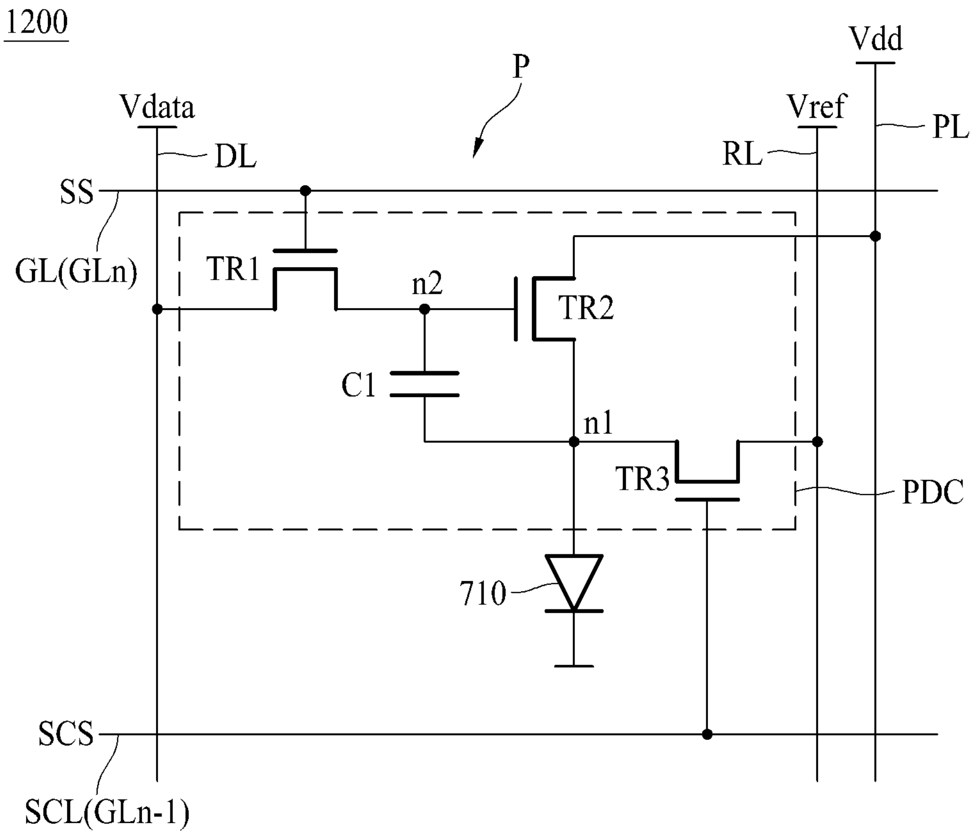
FIG. 18 is a circuit view illustrating any one pixel of a display apparatus according to still another embodiment of the present disclosure.

Next, FIG. 18 is a circuit view illustrating any one pixel P of a display apparatus 1200 according to further still another embodiment of the present disclosure. In particular, FIG. 18 is an equivalent circuit view illustrating a pixel P of an organic light emitting display apparatus.

The pixel P of the display apparatus 1200 shown in FIG. 18 includes an organic light emitting diode (OLED) that is a display device 710 and a pixel driving circuit PDC for driving the display device 710. The display device 710 is connected with the pixel driving circuit PDC. In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

Referring to FIG. 18, assuming that a gate line of an (n)th pixel P is "$GL_n$," a gate line of an (n−1)th pixel P adjacent to the (n)th pixel P is "$GL_{n-1}$" and the gate line "$GL_{n-1}$" of the (n−1)th pixel P serves as a sensing control line SCL of the (n)th pixel P. The pixel driving circuit PDC includes, for example, a first thin film transistor TR1 (switching transistor) connected with the gate line GL and the data line DL, a second thin film transistor TR2 (driving transistor) for controlling a magnitude of a current output to the display device 710 in accordance with the data voltage Vdata transmitted through the first thin film transistor TR1, and a third thin film transistor TR3 (reference transistor) for sensing characteristics of the second thin film transistor TR2.

A first capacitor C1 is positioned between the gate electrode G2 of the second thin film transistor TR2 and the display device 710. The first capacitor C1 is referred to as a storage capacitor Cst. The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to a first node n1 between the second thin film transistor TR2 and the display device 710 and the reference line RL, and thus is turned on or off by the sensing control signal SCS and senses characteristics of the second thin film transistor TR2, which is a driving transistor, for a sensing period. A second node n2 connected with the gate electrode G2 of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode G2 of the second thin film transistor TR2. The data voltage Vdata is charged in the first capacitor C1 formed between the gate electrode G2 and the source electrode S2 of the second thin film transistor TR2. When the second thin film transistor TR2 is turned on, the current is supplied to the display device 710 through the second thin film transistor TR2 in accordance with the driving voltage Vdd for driving the pixel, whereby light is output from the display device 710.

Figure 19:
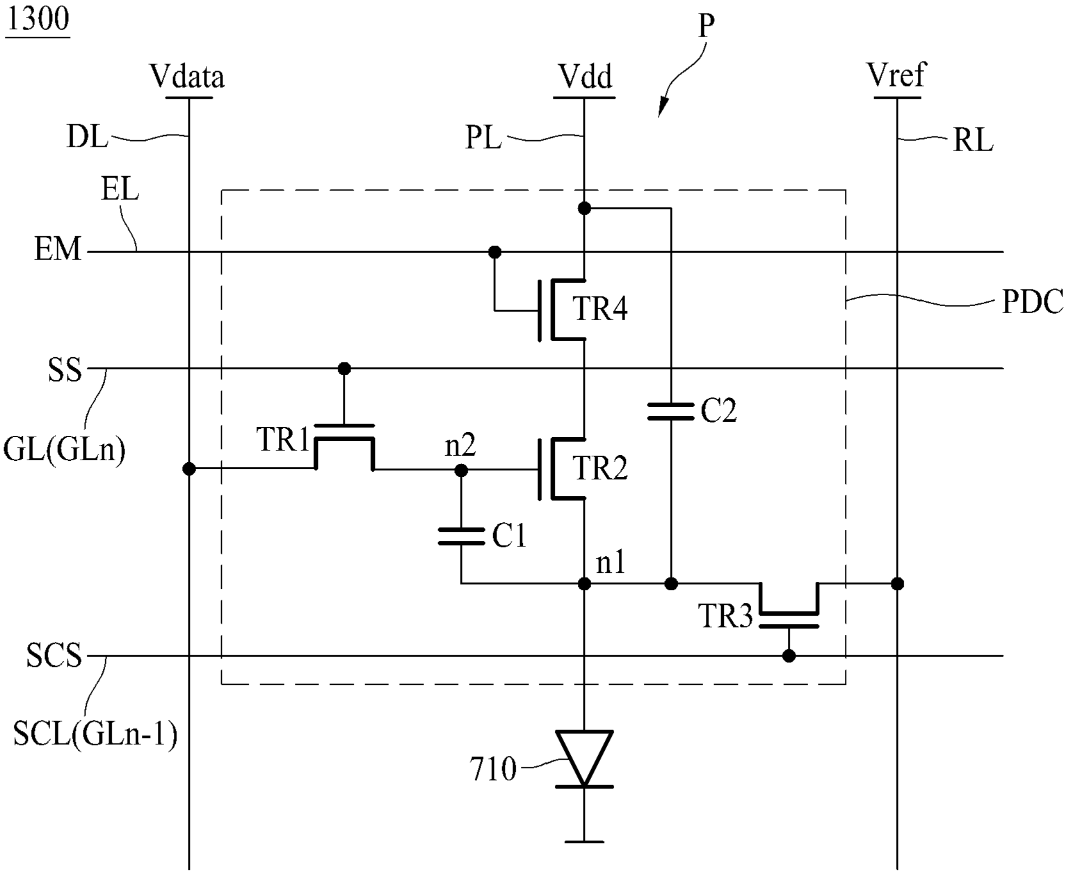
FIG. 19 is a circuit view illustrating any one pixel of a display apparatus according to further still another embodiment of the present disclosure.

Next, FIG. 19 is a circuit view illustrating any one pixel of a display apparatus 1300 according to further still another embodiment of the present disclosure. The pixel P of the display apparatus 1300 shown in FIG. 19 includes an organic light emitting diode (OLED) that is a display device 710 and a pixel driving circuit PDC for driving the display device 710. The display device 710 is connected with the pixel driving circuit PDC.

The pixel driving circuit PDC includes thin film transistors TR1, TR2, TR3 and TR4. In the pixel P, signal lines DL, EL, GL, PL, SCL and RL for supplying a driving signal to the pixel driving circuit PDC are disposed. In comparison with the pixel P of FIG. 18, the pixel P of FIG. 19 further includes an emission control line EL. An emission control signal EM is supplied to the emission control line EL. Also, the pixel driving circuit PDC of FIG. 19 further includes a fourth thin film transistor TR4 that is an emission control transistor for controlling a light emission timing of the second thin film transistor TR2, in comparison with the pixel driving circuit PDC of FIG. 18.

Referring to FIG. 19, assuming that a gate line of an (n)th pixel P is "$GL_n$," a gate line of an (n−1)th pixel P adjacent to the (n)th pixel P is "$GL_{n-1}$" and the gate line "$GL_{n-1}$" of the (n−1)th pixel P serves as a sensing control line SCL of the (n)th pixel P. A first capacitor C1 is positioned between the gate electrode G2 of the second thin film transistor TR2 and the display device 710. Also, a second capacitor C2 is positioned between one of terminals of the fourth thin film transistor TR4, to which a driving voltage Vdd is supplied, and one electrode of the display device 710.

The first thin film transistor TR1 is turned on by the scan signal SS supplied to the gate line GL to transmit the data voltage Vdata, which is supplied to the data line DL, to the gate electrode G2 of the second thin film transistor TR2. The third thin film transistor TR3 is connected to the reference line RL, and thus is turned on or off by the sensing control signal SCS and senses characteristics of the second thin film transistor TR2, which is a driving transistor, for a sensing period.

In addition, the fourth thin film transistor TR4 transfers the driving voltage Vdd to the second thin film transistor TR2 in accordance with the emission control signal EM, or shields the driving voltage Vdd. When the fourth thin film transistor TR4 is turned on, a current is supplied to the second thin film transistor TR2, whereby light is output from the display device 710. The pixel driving circuit PDC according to further still another embodiment of the present disclosure can be formed in various structures in addition to the above-described structure. The pixel driving circuit PDC may include, for example, five or more thin film transistors.

According to the present disclosure, the following advantages are obtained.

The thin film transistor according to one embodiment of the present disclosure has a large s-factor and at the same time has excellent ON-current characteristics. Therefore, when the thin film transistor is used in the display apparatus, a gray scale representation capability of the display apparatus can be improved, and current characteristics of the display apparatus can be also improved.

It will be apparent to those skilled in the art that the present disclosure described above is not limited by the above-described embodiments and the accompanying drawings and that various substitutions, modifications and variations can be made in the present disclosure without departing from the spirit or scope of the disclosures.

What is claimed is:

1. A thin film transistor comprising:
an active layer; and
a gate electrode at least partially overlapped with the active layer,
wherein the active layer includes:
a first active layer and a second active layer on the first active layer;
a channel;
a first connection portion contacting a first side of the channel; and
a second connection portion contacting a second side of the channel,
wherein the channel includes:
a first overlap area in which the first active layer and the second active layer overlap each other based on a plan view; and
a first non-overlap area in which the first active layer and the second active layer do not overlap each other based on the plan view,
wherein in the channel of the active layer, each of the first active layer and the second active layer extends from the first connection portion to the second connection portion, and
wherein the second active layer has a mobility greater than a mobility of the first active layer.

2. The thin film transistor of claim 1, wherein the first overlap area of the channel extends from the first connection portion to the second connection portion.

3. The thin film transistor of claim 1, wherein the first non-overlap area of the channel extends from the first connection portion to the second connection portion.

4. The thin film transistor of claim 1, wherein the second active layer covers an upper surface of the first active layer in the channel.

5. The thin film transistor of claim 1, wherein the second active layer is disposed in an area of the channel based on the plan view.

6. The thin film transistor of claim 1, wherein the first active layer is not disposed in the first non-overlap area of the channel.

7. The thin film transistor of claim 1, wherein the active layer further includes a third active layer on the second active layer,
wherein the third active layer extends from the first connection portion to the second connection portion in the channel, and
wherein the third active layer has a mobility smaller than a mobility of the second active layer.

8. The thin film transistor of claim 7, wherein the third active layer is disposed in the first overlap area and the first non-overlap area of the channel.

9. The thin film transistor of claim 7, wherein the third active layer is not disposed in the first non-overlap area of the channel.

10. The thin film transistor of claim 1, wherein the channel further includes a second non-overlap area in which the first active layer and the second active layer do not overlap each other based on the plan view, and wherein the second non-overlap area is spaced apart from the first non-overlap area and extends from the first connection portion to the second connection portion.

11. The thin film transistor of claim 10, wherein the first active layer is not disposed in the second non-overlap area of the channel.

12. The thin film transistor of claim 10, wherein the active layer further includes a third active layer on the second active layer, wherein the third active layer extends from the first connection portion to the second connection portion in the channel, and wherein the third active layer has a mobility smaller than a mobility of the second active layer.

13. The thin film transistor of claim 12, wherein the third active layer is disposed in the first overlap area, the first non-overlap area and the second non-overlap area of the channel.

14. The thin film transistor of claim 12, wherein the third active layer is not disposed in the second non-overlap area of the channel.

15. The thin film transistor of claim 1, wherein the channel further includes a second overlap area in which the first active layer and the second active layer overlap each other based on the plan view, and wherein the second overlap area is spaced apart from the first overlap area, and extends from the first connection portion to the second connection portion.

16. The thin film transistor of claim 15, wherein the active layer further includes a third active layer on the second active layer, wherein the third active layer extends from the first connection portion to the second connection portion in the channel, and wherein the third active layer has a mobility smaller than a mobility of the second active layer.

17. The thin film transistor of claim 16, wherein the third active layer is disposed in the first overlap area, the first non-overlap area and the second overlap area of the channel.

18. The thin film transistor of claim 16, wherein the third active layer is not disposed in the first non-overlap area of the channel.

19. The thin film transistor of claim 1, wherein the first active layer includes at least one of an IGZO (InGaZnO)-based oxide semiconductor material, a GZO (GaZnO)-based oxide semiconductor material, an IGO (InGaO)-based oxide semiconductor material, or a GZTO (GaZnSnO)-based oxide semiconductor material, and when the oxide semiconductor material of the first active layer includes gallium (Ga) and indium (In), a concentration of gallium (Ga) is higher than a concentration of indium (In) based on the number of moles [Ga concentration>In concentration].

20. The thin film transistor of claim 1, wherein the second active layer includes at least one of an IGZO (InGaZnO)-based oxide semiconductor material, an IZO (InZnO)-based oxide semiconductor material, an ITZO (InSnZnO)-based oxide semiconductor material, an IGZTO (InGaZnSnO)-based oxide semiconductor material, a FIZO (FeInZnO)-based semiconductor material, a ZnO-based oxide semiconductor material, a SIZO (SiInZnO)-based oxide semiconductor material, or a ZnON (Zn-Oxynitride)-based oxide semiconductor material, and when the oxide semiconductor material of the second active layer includes gallium (Ga) and indium (In), a concentration of indium (In) is higher than a concentration of gallium (Ga) based on the number of moles [Ga concentration<In concentration].

21. A display apparatus comprising the thin film transistor of claim 1.

* * * * *